United States Patent
Silverbrook (12)

(10) Patent No.: US 6,331,258 B1
(45) Date of Patent: *Dec. 18, 2001

(54) METHOD OF MANUFACTURE OF A BUCKLE PLATE INK JET PRINTER

(75) Inventor: Kia Silverbrook, Sydney (AU)

(73) Assignee: Silverbrook Research Pty Ltd, Balmain (AU)

( * ) Notice: Subject to any disclaimer, the term of this patent is extended or adjusted under 35 U.S.C. 154(b) by 0 days.

This patent is subject to a terminal disclaimer.

(21) Appl. No.: 09/113,074

(22) Filed: Jul. 10, 1998

(30) Foreign Application Priority Data

Jul. 15, 1997 (AU) .................................................. P07991
Jul. 15, 1997 (AU) .................................................. P08051

(51) Int. Cl.[7] ............................... B41J 2/04; H01L 21/302
(52) U.S. Cl. ............................... 216/27; 438/21; 347/54; 347/59
(58) Field of Search ............................... 216/27; 347/54, 347/59; 438/21

(56) References Cited

U.S. PATENT DOCUMENTS

| | | | |
|---|---|---|---|
| 4,824,073 | * | 4/1989 | Zdeblick ............................ 251/11 |
| 5,063,655 | * | 11/1991 | Lamey et al. ....................... 29/611 |
| 5,211,806 | * | 5/1993 | Wong et al. ...................... 217/273 |
| 5,684,519 | * | 11/1997 | Matoba et al. ...................... 347/54 |
| 5,804,083 | * | 9/1998 | Ishii et al. ........................... 216/2 |
| 5,825,383 | * | 10/1998 | Abe et al. ........................... 347/54 |
| 5,912,684 | * | 6/1999 | Fujii et al. .......................... 347/54 |
| 6,074,543 | * | 6/2000 | Yoshihira et al. .................. 216/27 |

OTHER PUBLICATIONS

Wolf, Stanley, Silicon Processing for the VLSI Era. vol. 2, pp. 368–381, 1990.*

* cited by examiner

*Primary Examiner*—Randy Gulakowski
*Assistant Examiner*—Shamim Ahmed

(57) ABSTRACT

This patent describes a method of manufacturing a a buckle plate ink jet print head wherein an array of nozzles are formed on a substrate utilizing planar monolithic deposition, lithographic and etching processes. Multiple ink jet heads are formed simultaneously on a single planar substrate such as a silicon wafer. The print heads can be formed utilizing standard VLSI/ULSI processing and can include integrated drive electronics formed on the same substrate. The drive electronics preferably being of a CMOS type. In the final construction, ink can be ejected from the substrate substantially normal to the substrate plane.

8 Claims, 7 Drawing Sheets

METHOD OF MANUFACTURE OF A BUCKLE PLATE INK JET PRINTER

CROSS REFERENCES TO RELATED APPLICATIONS

The following Australian provisional patent applications are hereby incorporated by cross-reference. For the purposes of location and identification, U.S. patent applications identified by their U.S. patent application serial numbers (USSN) are listed alongside the Australian applications from which the U.S. patent applications claim the right of priority.

| CROSS-REFERENCED AUSTRALIAN PROVISIONAL PATENT APPLICATION NO. | U.S. PATENT/ PATENT APPLICATION (CLAIMING RIGHT OF PRIORITY FROM AUSTRALIAN PROVISIONAL APPLICATION) | DOCKET NO. |
|---|---|---|
| PO7991 | 09/113,060 | ART01 |
| PO8505 | 09/113,070 | ART02 |
| PO7988 | 09/113,073 | ART03 |
| PO9395 | 09/112,748 | ART04 |
| PO8017 | 09/112,747 | ART06 |
| PO8014 | 09/112,776, PN 6227648 | ART07 |
| PO8025 | 09/112,750 | ART08 |
| PO8032 | 09/112,746 | ART09 |
| PO7999 | 09/112,743 | ART10 |
| PO7998 | 09/112,742 | ART11 |
| PO8031 | 09/112,741 | ART12 |
| PO8030 | 09/112,740, PN 6196541 | ART13 |
| PO7997 | 09/112,739 | ART15 |
| PO7979 | 09/113,053 | ART16 |
| PO8015 | 09/112,738 | ART17 |
| PO7978 | 09/113,067 | ART18 |
| PO7982 | 09/113,063 | ART19 |
| PO7989 | 09/113,069 | ART20 |
| PO8019 | 09/112,744 | ART21 |
| PO7980 | 09/113,058 | ART22 |
| PO8018 | 09/112,777 | ART24 |
| PO7938 | 09/113,224 | ART25 |
| PO8016 | 09/112,804 | ART26 |
| PO8024 | 09/112,805 | ART27 |
| PO7940 | 09/113,072 | ART28 |
| PO7939 | 09/112,785 | ART29 |
| PO8501 | 09/112,797, PN 6137500 | ART30 |
| PO8500 | 09/112,796 | ART31 |
| PO7987 | 09/113,071 | ART32 |
| PO8022 | 09/112,824 | ART33 |
| PO8497 | 09/113,090 | ART34 |
| PO8020 | 09/112,823 | ART38 |
| PO8023 | 09/113,222 | ART39 |
| PO8504 | 09/112,786 | ART42 |
| PO8000 | 09/113,051 | ART43 |
| PO7977 | 09/112,782 | ART44 |
| PO7934 | 09/113,056 | ART45 |
| PO7990 | 09/113,059 | ART46 |
| PO8499 | 09/113,091 | ART47 |
| PO8502 | 09/112,753 | ART48 |
| PO7981 | 09/113,055 | ART50 |
| PO7986 | 09/113,057 | ART51 |
| PO7983 | 09/113,054 | ART52 |
| PO8026 | 09/112,752 | ART53 |
| PO8027 | 09/112,759 | ART54 |
| PO8028 | 09/112,757 | ART56 |
| PO9394 | 09/112,758 | ART57 |
| PO9396 | 09/113,107 | ART58 |
| PO9397 | 09/112,829 | ART59 |
| PO9398 | 09/112,792 | ART60 |
| PO9399 | 6,106,147 | ART61 |
| PO9400 | 09/112,790 | ART62 |
| PO9401 | 09/112,789 | ART63 |
| PO9402 | 09/112,788 | ART64 |

-continued

| CROSS-REFERENCED AUSTRALIAN PROVISIONAL PATENT APPLICATION NO. | U.S. PATENT/ PATENT APPLICATION (CLAIMING RIGHT OF PRIORITY FROM AUSTRALIAN PROVISIONAL APPLICATION) | DOCKET NO. |
|---|---|---|
| PO9403 | 09/112,795 | ART65 |
| PO9405 | 09/112,749 | ART66 |
| PP0959 | 09/112,784 | ART68 |
| PP1397 | 09/112,783 | ART69 |
| PP2370 | 09/112,781 | DOT01 |
| PP2371 | 09/113,052 | DOT02 |
| PO8003 | 09/112,834 | Fluid01 |
| PO8005 | 09/113,103 | Fluid02 |
| PO9404 | 09/113,101 | Fluid03 |
| PO8066 | 09/112,751, PN 6227652 | IJ01 |
| PO8072 | 09/112,787, PN 6213588 | IJ02 |
| PO8040 | 09/112,802, PN 6213589 | IJ03 |
| PO8071 | 09/112,803, PN 6231163 | IJ04 |
| PO8047 | 09/113,097, PN 6247795 | IJ05 |
| PO8035 | 09/113,099 | IJ06 |
| PO8044 | 09/113,084, PN 6244691 | IJ07 |
| PO8063 | 09/113,066 | IJ08 |
| PO8057 | 09/112,778 | IJ09 |
| PO8056 | 09/112,779, PN 6220694 | IJ10 |
| PO8069 | 09/113,077 | IJ11 |
| PO8049 | 09/113,061 | IJ12 |
| PO8036 | 09/112,818, PN 6234610 | IJ13 |
| PO8048 | 09/112,816, PN 6247793 | IJ14 |
| PO8070 | 09/112,772 | IJ15 |
| PO8067 | 09/112,819, PN 6241342 | IJ16 |
| PO8001 | 09/112,815, PN 6247792 | IJ17 |
| PO8038 | 09/113,096 | IJ18 |
| PO8033 | 09/113,068 | IJ19 |
| PO8002 | 09/113,095 | IJ20 |
| PO8068 | 09/112,808 | IJ21 |
| PO8062 | 09/112,809 | IJ22 |
| PO8034 | 09/112,780, PN 6239821 | IJ23 |
| PO8039 | 09/113,083 | IJ24 |
| PO8041 | 09/113,121 | IJ25 |
| PO8004 | 09/113,122 | IJ26 |
| PO8037 | 09/112,793 | IJ27 |
| PO8043 | 09/112,794 | IJ28 |
| PO8042 | 09/113,128 | IJ29 |
| PO8064 | 09/113,127 | IJ30 |
| PO9389 | 09/112,756 | IJ31 |
| PO9391 | 09/112,755, PN 6234609 | IJ32 |
| PP0888 | 09/112,754, PN 6238040 | IJ33 |
| PP0891 | 09/112,811, PN 6188415 | IJ34 |
| PP0890 | 09/112,812, PN 6227654 | IJ35 |
| PP0873 | 09/112,813, PN 6209989 | IJ36 |
| PP0993 | 09/112,814, PN 6247791 | IJ37 |
| PP0890 | 09/112,764 | IJ38 |
| PP1398 | 09/112,765, PN 6217153 | IJ39 |
| PP2592 | 09/112,767 | IJ40 |
| PP2593 | 09/112,768 | IJ41 |
| PP3991 | 09/112,807 | IJ42 |
| PP3987 | 09/112,806 | IJ43 |
| PP3985 | 09/112,820 | IJ44 |

-continued

| CROSS-REFERENCED AUSTRALIAN PROVISIONAL PATENT APPLICATION NO. | U.S. PATENT/ PATENT APPLICATION (CLAIMING RIGHT OF PRIORITY FROM AUSTRALIAN PROVISIONAL APPLICATION) | DOCKET NO. |
|---|---|---|
| PP3983 | 09/112,821 | IJ45 |
| PO7935 | 09/112,822, PN 6224780 | IJM01 |
| PO7936 | 09/112,825, PN 6235212 | IJM02 |
| PO7937 | 09/112,826 | IJM03 |
| PO8061 | 09/112,827 | IJM04 |
| PO8054 | 09/112,828 | IJM05 |
| PO8065 | 6,071,750 | IJM06 |
| PO8055 | 09/113,108 | IJM07 |
| PO8053 | 09/113,109 | IJM08 |
| PO8078 | 09/113,123 | IJM09 |
| PO7933 | 09/113,114, PN 6225138 | IJM10 |
| PO7950 | 09/113,115 | IJM11 |
| PO7949 | 09/113,129 | IJM12 |
| PO8060 | 09/113,124 | IJM13 |
| PO8059 | 09/113,125, PN 6231773 | IJM14 |
| PO8073 | 09/113,126, PN 6190931 | IJM15 |
| PO8076 | 09/113,119 | IJM16 |
| PO8075 | 09/113,120 | IJM17 |
| PO8079 | 09/113,221 | IJM18 |
| PO8050 | 09/113,116 | IJM19 |
| PO8052 | 09/113,118 | IJM20 |
| PO7948 | 09/113,117 | IJM21 |
| PO7951 | 09/113,113, PN 6231772 | IJM22 |
| PO8074 | 09/113,130 | IJM23 |
| PO7941 | 09/113,110 | IJM24 |
| PO8077 | 09/113,112 | IJM25 |
| PO8058 | 09/113,087 | IJM26 |
| PO8051 | 09/113,074 | IJM27 |
| PO8045 | 6,111,754 | IJM28 |
| PO7952 | 09/113,088 | IJM29 |
| PO8046 | 09/112,771 | IJM30 |
| PO9390 | 09/112,769 | IJM31 |
| PO9392 | 09/112,770 | IJM32 |
| PP0889 | 09/112,798 | IJM35 |
| PP0887 | 09/112,801 | IJM36 |
| PP0882 | 09/112,800 | IJM37 |
| PP0874 | 09/112,799 | IJM38 |
| PP1396 | 09/113,098 | IJM39 |
| PP3989 | 09/112,833, PN 6228668 | IJM40 |
| PP2591 | 09/112,832, PN 6180427 | IJM41 |
| PP3990 | 09/112,831, PN 6171875 | IJM42 |
| PP3986 | 09/112,830 | IJM43 |
| PP3984 | 09/112,836, PN 6245247 | IJM44 |
| PP3982 | 09/112,835 | IJM45 |
| PP0895 | 091113,102, PN 6231148 | IR01 |
| PP0870 | 09/113,106 | IR02 |
| PP0869 | 09/113,105 | IR04 |
| PP0887 | 09/113,104 | IR05 |
| PP0885 | 09/112,810 | IR06 |
| PP0884 | 09/112,766 | IR10 |
| PP0886 | 09/113,085 | IR12 |
| PP0871 | 09/113,086 | IR13 |
| PP0876 | 09/113,094 | IR14 |
| PP0877 | 09/112,760 | IR16 |
| PP0878 | 09/112,773, PN 6196739 | IR17 |
| PP0879 | 09/112,774 | IR18 |
| PP0883 | 09/112,775 | IR19 |
| PP0880 | 6,152,619 | IR20 |
| PP0881 | 09/113,092 | IR21 |
| PO8006 | 6,087,638 | MEMS02 |
| PO8007 | 09/113,093 | MEMS03 |
| PO8008 | 09/113,062 | MEMS04 |
| PO8010 | 6,041,600 | MEMS05 |
| PO8011 | 09/113,082 | MEMS06 |
| PO7947 | 6,067,797 | MEMS07 |
| PO7944 | 09/113,080 | MEMS09 |
| PO7946 | 6,044,646 | MEMS10 |
| PO9393 | 09/113,065 | MEMS11 |
| PP0875 | 09/113,078 | MEMS12 |
| PP0894 | 09/113,075 | MEMS13 |

FIELD OF THE INVENTION

The present invention relates to the manufacture of ink jet print heads and, in particular, discloses a method of manufacture of a Buckle Plate Ink Jet Printer.

BACKGROUND OF THE INVENTION

Many ink jet printing mechanisms are known. Unfortunately, in mass production techniques, the production of ink jet heads is quite difficult. For example, often, the orifice or nozzle plate is constructed separately from the ink supply and ink ejection mechanism and bonded to the mechanism at a later stage (Hewlett-Packard Journal, Vol. 36 no 5, pp33–37 (1985)). These separate material processing steps required in handling such precision devices often add a substantial expense in manufacturing.

Additionally, side shooting ink jet technologies (U.S. Pat. No. 4,899,181) are often used but again, this limits the amount of mass production throughput given any particular capital investment.

Additionally, more esoteric techniques are also often utilised. These can include electroforming of nickel stage (Hewlett-Packard Journal, Vol. 36 no 5, pp33–37 (1985), electro-discharge machining, laser ablation (U.S. Pat. No. 5,208,604), micro-punching, etc.

The utilisation of the above techniques is likely to add substantial expense to the mass production of ink jet print heads and therefore add substantially to their final cost.

It would therefore be desirable if an efficient system for the mass production of ink jet print heads could be developed.

SUMMARY OF THE INVENTION

It is an object of the present invention to provide an alternative arrangement of a buckle/diaphragm actuated ink jet print head, simple and compact in construction however, allowing for a higher speed operation of the ink jet head through the utilisation of substantially less energy per ink drop ejected.

In accordance with a first aspect of the present invention, there is provided a method of manufacturing a buckle plate ink jet print head wherein an array of nozzles are formed on a substrate utilising planar monolithic deposition, lithographic and etching processes. Preferably, multiple ink jet heads are formed simultaneously on a single planar substrate such as a silicon wafer.

The print heads can be formed utilising standard vlsi/ulsi processing and can include integrated drive electronics formed on the same substrate. The drive electronics preferably are of a CMOS type. In the final construction, ink can be ejected from the substrate substantially normal to the substrate.

BRIEF DESCRIPTION OF THE DRAWINGS

Notwithstanding any other forms which may fall within the scope of the present invention, preferred forms of the invention will now be described, by way of example only, with reference to the accompanying drawings in which.

DESCRIPTION OF PREFERRED AND OTHER EMBODIMENTS

In the preferred embodiment, a "roof shooting" ink jet print head is constructed utilising a buckle plate actuator for the ejection of ink. In the preferred embodiment, the buckle plate actuator is constructed from polytetrafluoroethylene (PTFE) which provides superior thermal expansion characteristics. The PTFE is heated by an integral, serpentine shaped heater, which preferably is constructed from a resistive material, such as copper.

Figure 1:
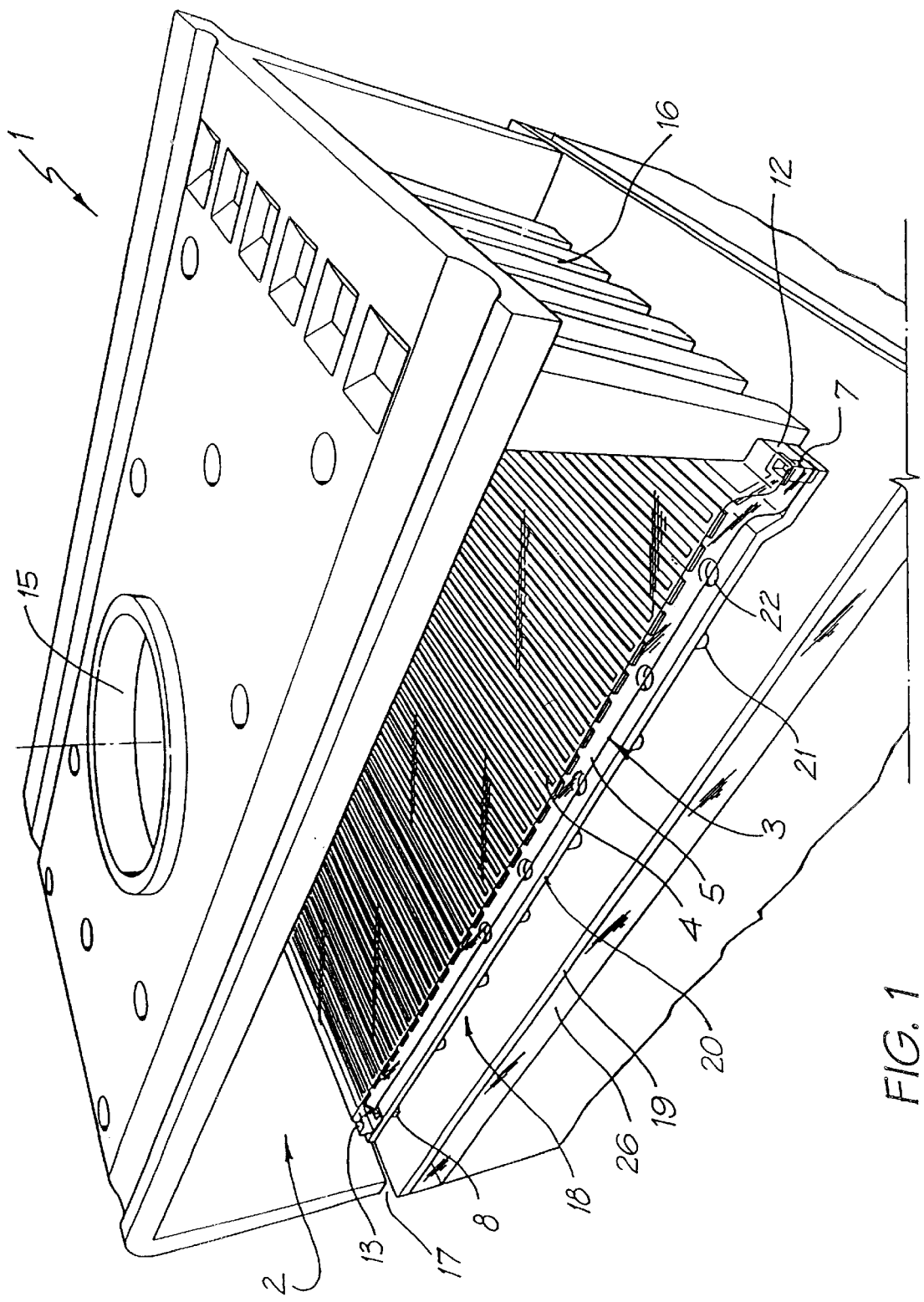
FIG. 1 is a perspective view partly in section of a single ink jet nozzle constructed in accordance with the preferred embodiment.

Turning now to FIG. 1 there is shown a sectional perspective view of an ink jet printhead 1 of the preferred embodiment. The ink jet printhead includes a nozzle chamber 2 in which ink is stored to be ejected. The chamber 2 can be independently connected to an ink supply (not shown) for the supply and refilling of the chamber. At the base of the chamber 2 is a buckle plate 3 which comprises a heater element 4 which can be of an electrically resistive material such as copper. The heater element 4 is encased in a polytetrafluoroethylene layer 5. The utilisation of the PTFE layer 5 allows for high rates of thermal expansion and therefore more effective operation of the buckle plate 3. FIFE has a high coefficient of thermal expansion ($770\times10^4$) with the copper having a much lower degree of thermal expansion. The copper heater element 4 is therefore fabricated in a serpentine pattern so as to allow the expansion of the PTFE layer to proceed unhindered. The serpentine fabrication of the heater element 4 means that the two coefficients of thermal expansion of the PTFE and the heater material need not be closely matched. The PIFE is primarily chosen for its high thermal expansion properties.

Current can be supplied to the buckle plate 3 by means of connectors 7, 8 which inter-connect the buckle plate 3 with a lower drive circuitry and logic layer 26. Hence, to operate the ink jet head 1, the heater coil 4 is energised thereby heating the PTFE 5. The PTFE 5 expands and buckles between end portions 12, 13. The buckle causes initial ejection of ink out of a nozzle 15 located at the top of the nozzle chamber 2. There is an air bubble between the buckle plate 3 and the adjacent wall of the chamber which forms due to the hydrophobic nature of the PTFE on the back surface of the buckle plate 3. An air vent 17 connects the air bubble to the ambient air through a channel 18 formed between a nitride layer 19 and an additional BE layer 20, separated by posts, e.g. 21, and through holes, e.g. 22, in the PTFE layer 20. The air vent 17 allows the buckle plate 3 to move without being held back by a reduction in air pressure as the buckle plate 3 expands. Subsequently, power is turned off to the buckle plate 3 resulting in a collapse of the buckle plate and the sucking back of some of the ejected ink. The forward motion of the ejected ink and the sucking back is resolved by an ink drop breaking off from the main volume of ink and continuing onto a page. Ink refill is then achieved by surface tension effects across the nozzle part 15 and a resultant inflow of ink into the nozzle chamber 2 through the grilled supply channel 16.

Subsequently the nozzle chamber 2 is ready for refiring.

It has been found in simulations of the preferred embodiment that the utilization of the FIR layer and serpentine heater arrangement allows for a substantial reduction in energy requirements of operation in addition to a more compact design.

Figure 2:
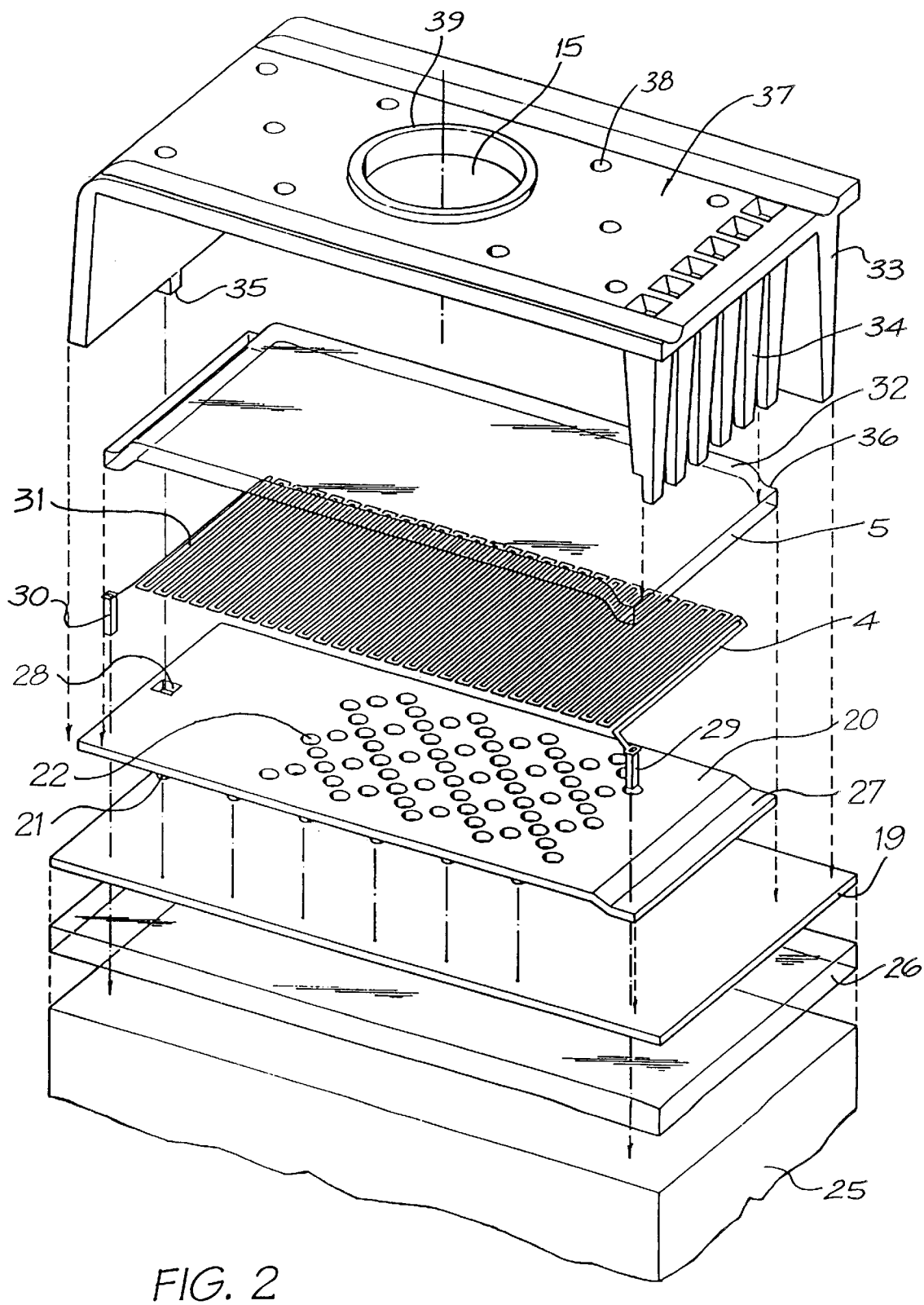
FIG. 2 is an exploded perspective view partly in section illustrating the construction of a single ink nozzle in accordance with the preferred embodiment of the present invention.

Turning now to FIG. 2, there is provided an exploded perspective view partly in section illustrating the construction of a single ink jet nozzle in accordance with the preferred embodiment. The nozzle arrangement 1 is fabricated on top of a silicon wafer 25. The nozzle arrangement 1 can be constructed on the silicon wafer 25 utilising standard semi-conductor processing techniques in addition to those techniques commonly used for the construction of micro-electro-mechanical systems (MEMS). For a general introduction to a micro-electro mechanical system (MEMS) reference is made to standard proceedings in this field including the proceedings of the SPIE (International Society for Optical Engineering), volumes 2642 and 2882 which contain the proceedings for recent advances and conferences in this field.

On top of the silicon layer 25 is deposited a two level CMOS circuitry layer 26 which substantially comprises glass, in addition to the usual metal layers. Next a nitride layer 19 is deposited to protect and passivate the underlying layer 26. The nitride layer 19 also includes vias for the interconnection of the heater element 4 to the CMOS layer 26. Next, a PTFE layer 20 is constructed having the aforementioned holes, e.g. 22, and posts, e.g. 21. The structure of the PTFE layer 20 can be formed by first laying down a sacrificial glass layer (not shown) onto which the PTFE layer 20 is deposited. The PTFE layer 20 includes various features, for example, a lower ridge portion 27 in addition to a hole 28 which acts as a via for the subsequent material layers. The buckle plate 3 (FIG. 1) comprises a conductive layer 31 and a PTFE layer 32. A first, thicker PTFE layer is deposited onto a sacrificial layer (not shown). Next, a conductive layer 31 is deposited including contacts 29, 30. The conductive layer 31 is then etched to form a serpentine pattern. Next, a thinner, second PTFE layer is deposited to complete the buckle plate 3 (FIG. 1) structure.

Finally, a nitride layer can be deposited to form the nozzle chamber proper. The nitride layer can be formed by first laying down a sacrificial glass layer and etching this to form walls, e.g. 33, and grilled portions, e.g. 34. Preferably, the mask utilised results in a first anchor portion 35 which mates with the hole 28 in layer 20. Additionally, the bottom surface of the grill, for example 34 meets with a corresponding step 36 in the P layer 32. Next, a top nitride layer 37 can be formed having a number of holes, e.g. 38, and nozzle port 15 around which a rim 39 can be etched through etching of the nitride layer 37. Subsequently the various sacrificial layers can be etched away so as to release the structure of the thermal actuator and the air vent channel 18 (FIG. 1).

Figure 3:
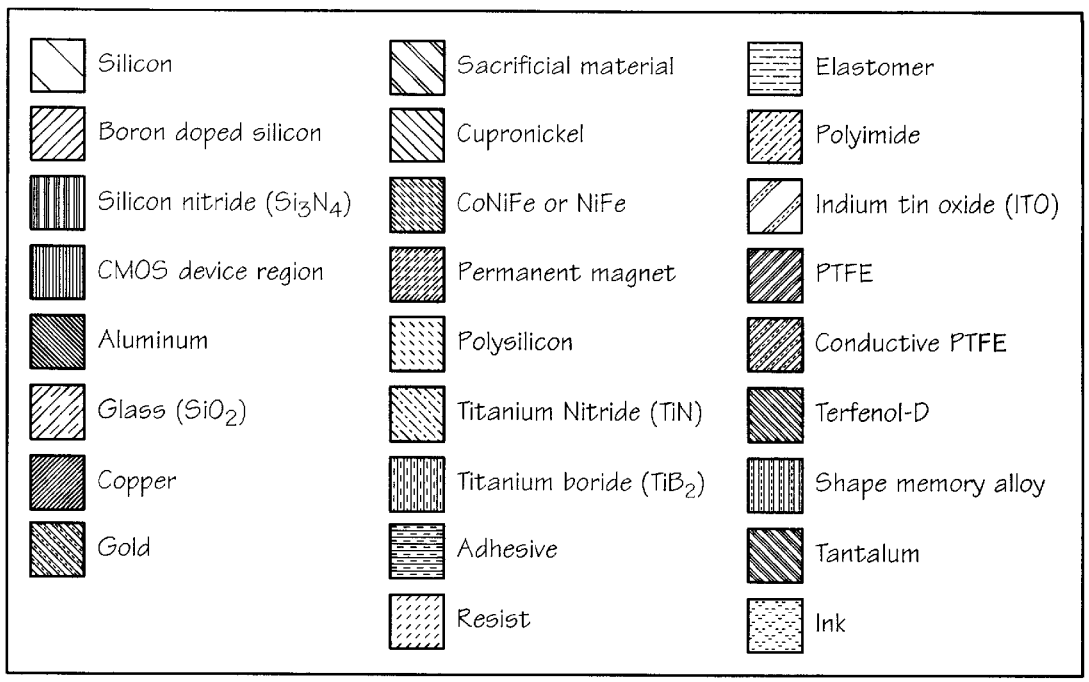
FIG. 3 provides a legend of the materials indicated in FIGS. 4 to 16.
Figure 4:
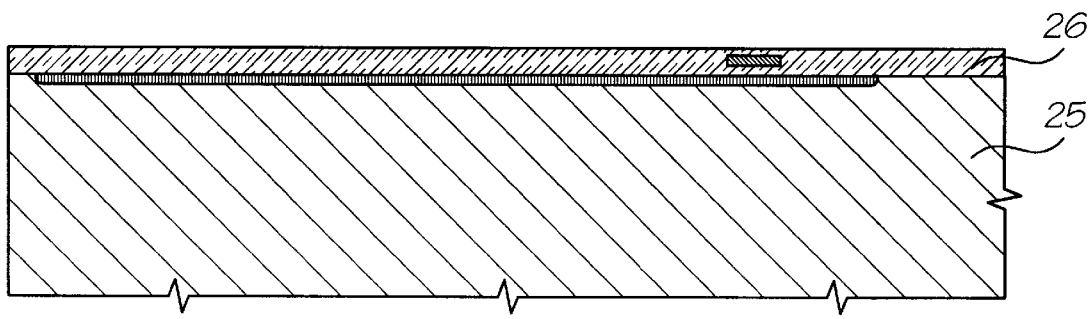
FIG. 4 shows a sectional side view of initial manufacturing step of an ink jet print heat nozzle showing a silicon wafer layer and a buried, boron doped silicon layer.
Figure 5:
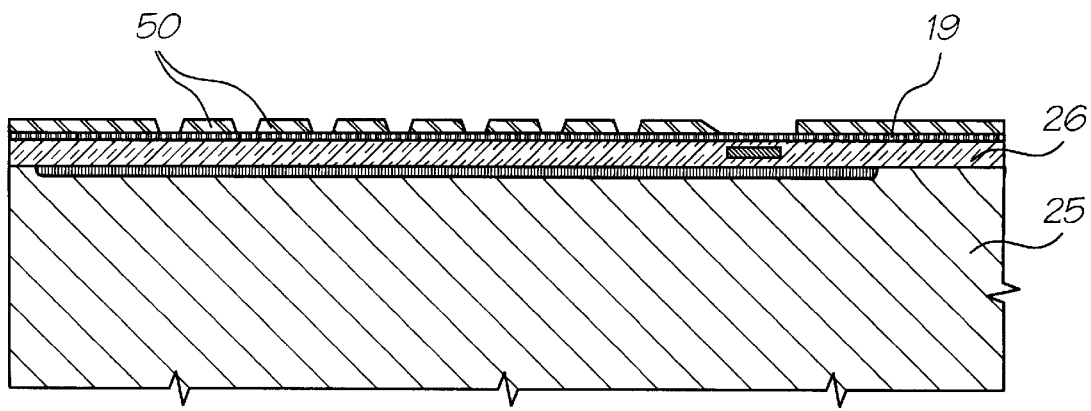
FIG. 5 shows a step of depositing and etching a first sacrificial layer.
Figure 6:
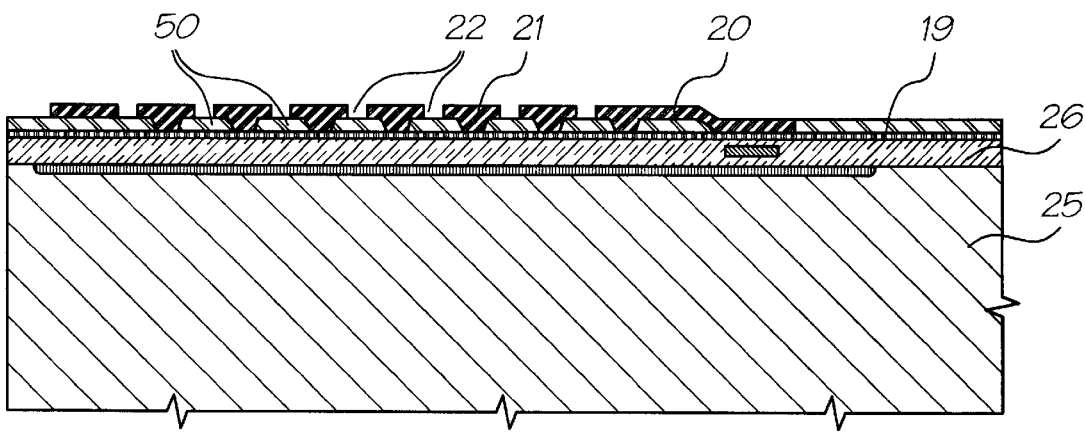
FIG. 6 shows a step of depositing and etching a first permanent layer.
Figure 7:
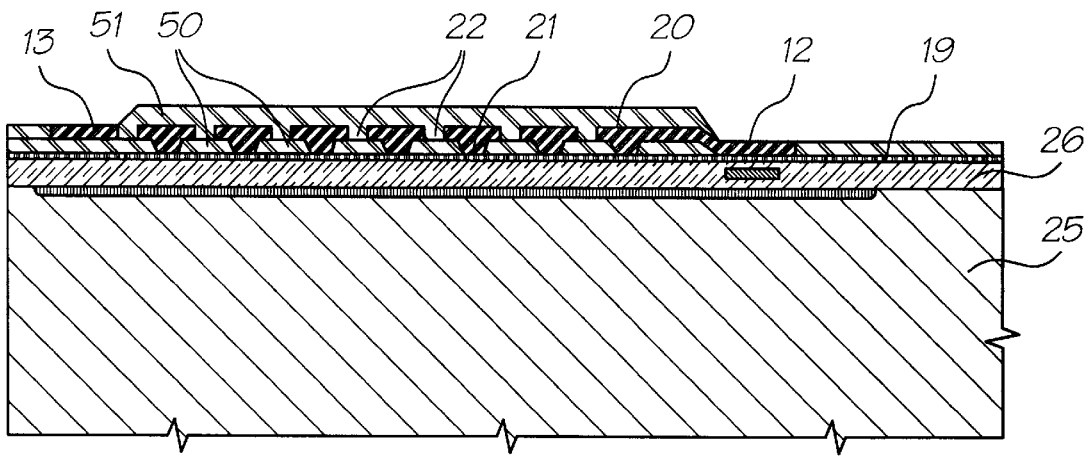
FIG. 7 shows a step of depositing and etching a second sacrificial layer.
Figure 8:
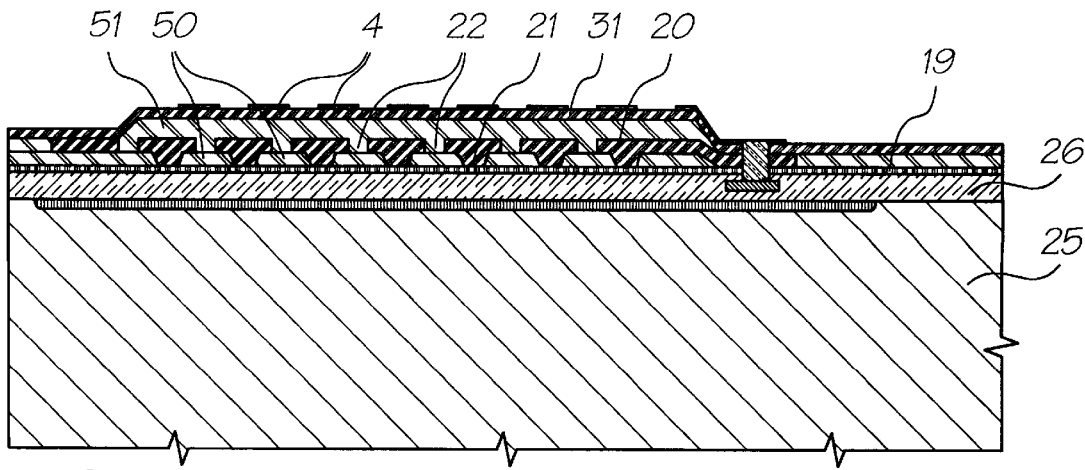
FIG. 8 shows a step of depositing and etching a second permanent layer and a permanent heating means layer.
Figure 9:
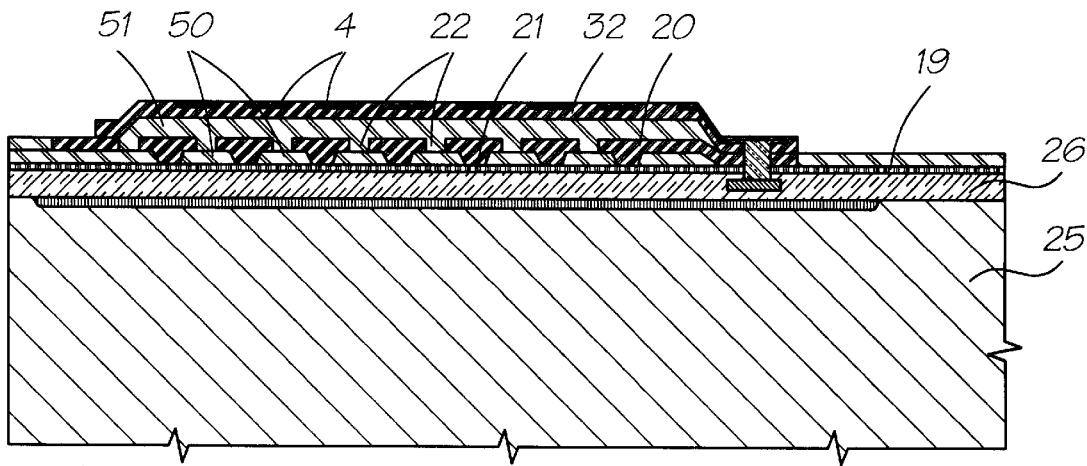
FIG. 9 shows a step of depositing and etching a third permanent layer.
Figure 10:
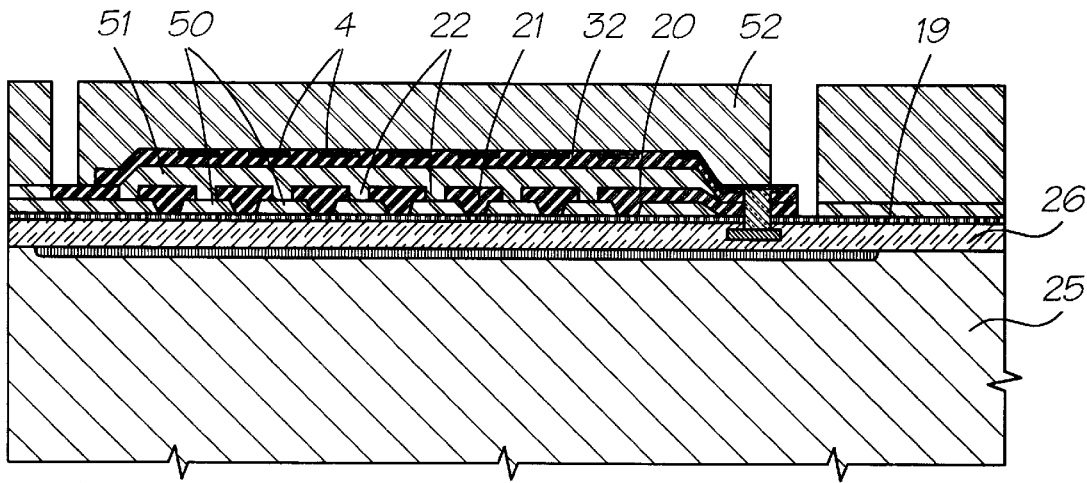
FIG. 10 shows a step of deposing and etching a third sacrificial layer.
Figure 11:
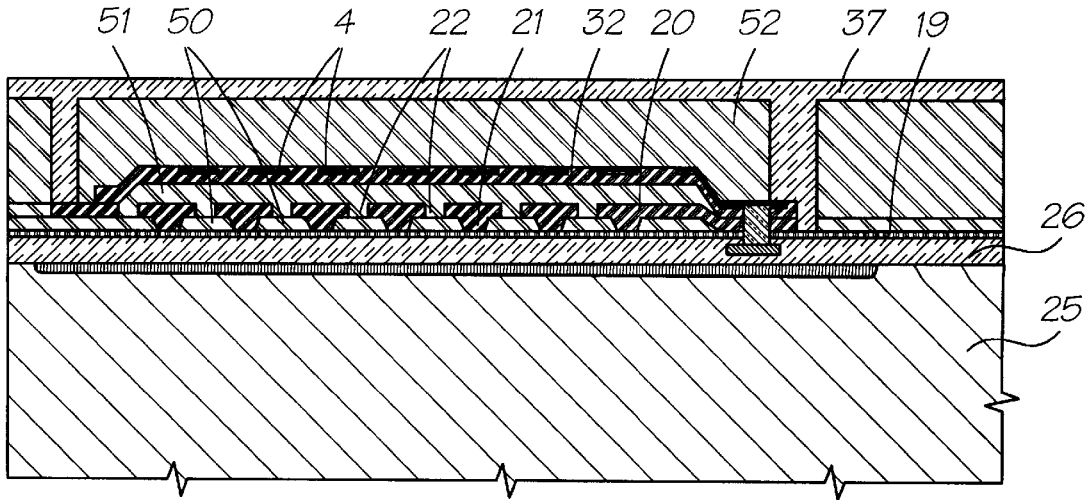
FIG. 11 shows a step of depositing a final permanent layers.
Figure 12:
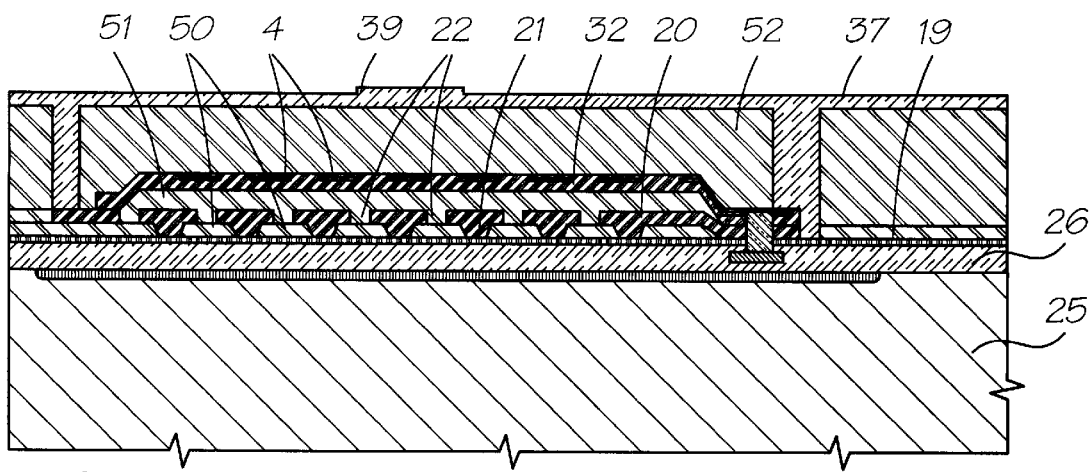
FIG. 12 shows a step of etching the final permanent layer.
Figure 13:
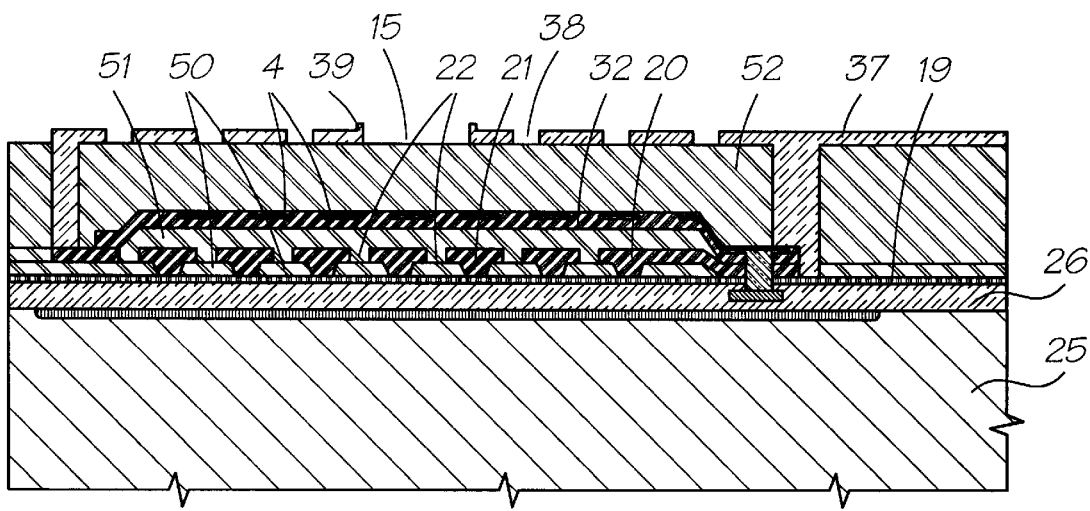
FIG. 13 shows a step of further etching the final permanent layer.
Figure 14:
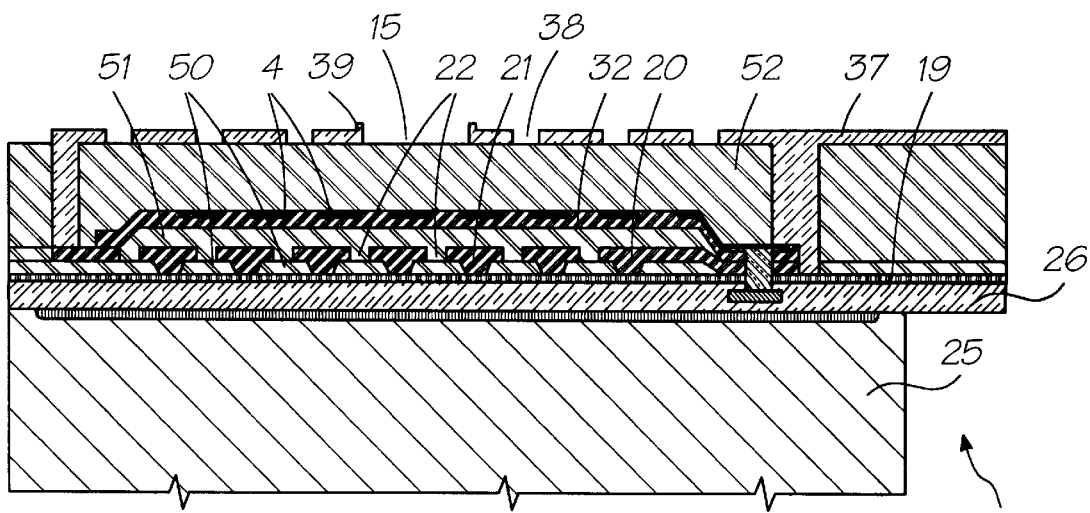
FIG. 14 shows a step of back etching through the silicon wafer layer.
Figure 15:
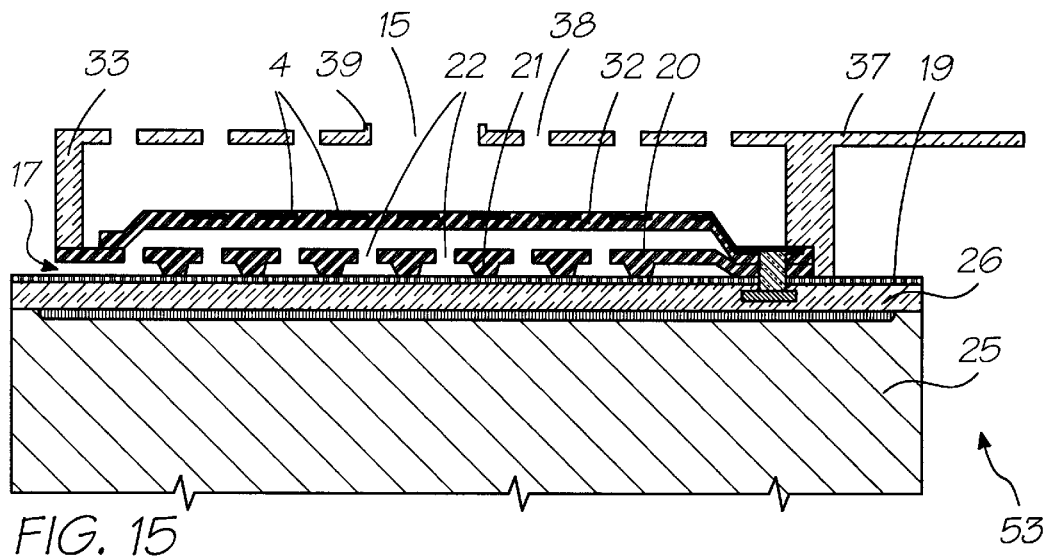
FIG. 15 shows a step of etching the sacrificial layers.
Figure 16:
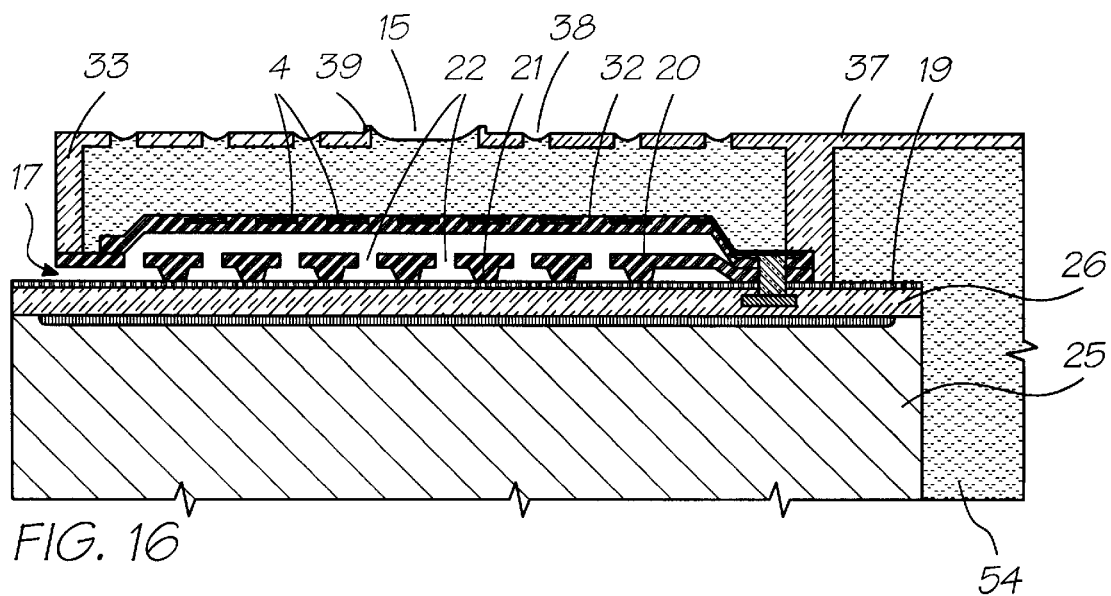
FIG. 16 shows a step of filling the completed ink jet nozzle with ink.

One form of detailed manufacturing process which can be used to fabricate monolithic ink jet print heads operating in accordance with the principles taught by the present embodiment can proceed utilizing the following steps:

1. Using a double sided polished wafer 25, complete drive transistors, data distribution, and timing circuits 26 using a 0.5 micron, one poly, 2 metal CMOS process. Relevant features of the wafer 25 at this step are shown in FIG. 4. For clarity, these diagrams may not be to scale, and may not represent a cross section though any single plane of the nozzle. FIG. 3 is a key to representations of various materials in these manufacturing diagrams, and those of other cross referenced ink jet configurations.
2. Deposit 1 micron of low stress nitride 19. This acts as a barrier to prevent ink diffusion through the silicon dioxide of the chip surface.
3. Deposit 2 microns of sacrificial material 50 (e.g. polyimide).
4. Etch the sacrificial layer 50 using Mask 1. This mask defines the PTFE venting layer support pillars 21 and anchor point This step is shown in FIG. 5.
5. Deposit 2 microns of PTFE 20.
6. Etch PTFE the 20 using Mask 2. This mask defines the edges of the PTFE venting layer 20, and the holes 22 in this layer 20. This step is shown in FIG. 6.
7. Deposit 3 microns of sacrificial material 51.
8. Etch the sacrificial layer 51 using Mask 3. This mask defines the anchor points 12, 13 at both ends of the buckle actuator. This step is shown in FIG. 7.
9. Deposit 1.5 microns of PTFE 31.
10. Deposit and pattern resist using Mask 4. This mask defines the heater 11.
11. Deposit 0.5 microns of gold (or other heater material with a low Young's modulus) and strip the resist. Steps 10 and 11 form a lift-off process. This step is shown in FIG. 8.
12. Deposit 0.5 microns of PTFE 32.
13. Etch the PTFE 32 down to the sacrificial layer 51 using Mask 5. This mask defines the actuator paddle 3 and the bond pads. This step is shown in FIG. 9.
14. Wafer probe. All electrical connections are complete at this point, and the chips are not yet separated.
15. Plasma process the PTFE to make the top and side surfaces of the buckle actuator 3 hydrophilic. This allows the nozzle chamber 2 to fill by capillarity.
16. Deposit 10 microns of sacrificial material 52.
17. Etch the sacrificial material 52 down to nitride 19 using Mask 6. This mask defines the nozzle chamber 2. This step is shown in FIG. 10.
18. Deposit 3 microns of PECVD glass 37. This step is shown in FIG. 11.
19. Etch to a depth of 1 micron using Mask 7. This mask defines the nozzle rim 39. This step is shown in FIG. 12.
20. Etch down to the sacrificial layer 52 using Mask 8. This mask defines the nozzle 15 and the sacrificial etch access holes 38. This step is shown in FIG. 13.
21. Back-etch completely through the silicon wafer 25 (with, for example, an ASE Advanced Silicon Etcher from Surface Technology Systems) using Mask 9. This mask defines the ink inlets which are etched through the wafer 25. The wafer 25 is also diced by this etch. This step is shown in FIG. 14.
22. Back-etch the CMOS oxide layers 26 and subsequently deposited nitride layers 19 and sacrificial layer 50, 51 through to PTFE 20, 32 using the back-etched silicon as a mask.
23. Etch the sacrificial material 52. The nozzle chambers are cleared, the actuators freed, and the chips are separated by this etch. This step is shown in FIG. 15.
24. Mount the print heads in their packaging, which may be a molded plastic former incorporating ink channels which supply the appropriate color ink to the ink inlets at the back of the wafer.
25. Connect the print heads to their interconnect systems. For a low profile connection with minimum disruption of airflow, TAB may be used. Wire bonding may also be used if the printer is to be operated with sufficient clearance to the paper.
26. Hydrophobize the front surface of the print heads.
27. Fill the completed print heads with ink 54 and test them. A filled nozzle is shown in FIG. 16.

It would be appreciated by a person skilled in the art that numerous variations and/or modifications may be made to the present invention as shown in the preferred embodiment without departing from the spirit or scope of the invention as broadly described. The preferred embodiment is, therefore, to be considered in all respects to be illustrative and not restrictive.

The presently disclosed ink jet printing technology is potentially suited to a wide range of printing systems including: color and monochrome office printers, short run digital printers, high speed digital printers, offset press supplemental printers, low cost scanning printers, high speed pagewidth printers, notebook computers with in-built pagewidth printers, portable color and monochrome printers, color and monochrome copiers, color and monochrome facsimile machines, combined printer, facsimile and copying machines, label printers, large format plotters, photograph copiers, printers for digital photographic 'minilabs', video printers, PHOTO CD (PHOTO CD is a Registered Trade Mark of Eastman Kodak Company) printers, portable printers for PDAs, wallpaper printers, indoor sign printers, billboard printers, fabric printers, camera printers and fault tolerant commercial printer arrays.

Ink Jet Technologies

The embodiments of the invention use an ink jet printer type device. Of course many different devices could be used. However presently popular ink jet printing technologies are unlikely to be suitable. The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of pagewidth print heads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)

high resolution capability (1,600 dpi or more)

photographic quality output low manufacturing cost small size (pagewidth times minimum cross section)

high speed (<2 seconds per page).

All of these features can be met or exceeded by the ink jet systems described below with differing levels of difficulty. Forty-five different ink jet technologies have been developed by the Assignee to give a wide range of choices for high volume manufacture. These technologies form part of separate applications assigned to the present Assignee as set out in the table above under the heading Cross References to Related Applications.

The ink jet designs shown here are suitable for a wide range of digital printing systems, from battery powered one-time use digital cameras, through to desktop and network printers, and through to commercial printing systems For ease of manufacture using standard process equipment, the print head is designed to be a monolithic 0.5 micron CMOS chip with MEMS post processing. For color photographic applications, the print head is 100 mm long, with a width which depends upon the ink jet type. The smallest print head designed is IJ38, which is 0.35 mm wide, giving a chip area of 35 square mm. The print heads each contain 19,200 nozzles plus data and control circuitry.

Ink is supplied to the back of the print head by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer.

The print head is connected to the camera circuitry by tape automated bonding.

Tables of Drop-on-Demand Ink Jets

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)

Basic operation mode (7 types)

Auxiliary mechanism (8 types)

Actuator amplification or modification method (17 types)

Actuator motion (19 types)

Nozzle refill method (4 types)

Method of restricting back-flow through inlet (10 types)

Nozzle clearing method (9 types)

Nozzle plate construction (9 types)

Drop ejection direction (5 types)

Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. These are designated IJ01 to IJ45 which matches the docket numbers in the in the table under the heading Cross References to Related Applications.

Other ink jet configurations can readily be derived from these forty-five examples by substituting alternative configurations along one or more of the 11 axes. Most of the IJ01 to IJ45 examples can be made into ink jet print heads with characteristics superior to any currently available ink jet technology.

Where there are prior art examples known to the inventor, one or more of these examples are listed in the examples column of the tables below. The IJ01 to IJ45 series are also listed in the examples column. In some cases, a printer may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| ACTUATOR MECHANISM (APPLIED ONLY TO SELECTED INK DROPS) | | | | |
|---|---|---|---|---|
| | Description | Advantages | Disadvantages | Examples |
| Thermal bubble | An electrothermal heater heats the ink to above boiling point, transferring significant heat to the aqueous | Large force generated Simple construction No moving parts | High power Ink carrier limited to water Low efficiency High temperatures | Canon Bubblejet 1979 Endo et al GB patent 2,007,162 Xerox heater-in-pit 1990 Hawkins et |

ACTUATOR MECHANISM (APPLIED ONLY TO SELECTED INK DROPS)
-continued

| | Description | Advantages | Disadvantages | Examples |
|---|---|---|---|---|
| | ink. A bubble nucleates and quickly forms, expelling the ink. The efficiency of the process is low, with typically less than 0.05% of the electrical energy being transformed into kinetic energy of the drop. | Fast operation Small chip area required for actuator | required High mechanical stress Unusual materials required Large drive transistors Cavitation causes actuator failure Kogation reduces bubble formation Large print heads are difficult to fabricate | al USP 4,899,181 Hewlett-Packard TIJ 1982 Vaught et al USP 4,490,728 |
| Piezo-electric | A piezoelectric crystal such as lead lanthanum zirconate (PZT) is electrically activated, and either expands, shears, or bends to apply pressure to the ink, ejecting drops. | Low power consumption Many ink types can be used Fast operation High efficiency | Very large area required for actuator Difficult to integrate with electronics High voltage drive transistors required Full pagewidth print heads impractical due to actuator size Requires electrical poling in high field strengths during manufacture | Kyser et al USP 3,946,398 Zoltan USP 3,683,212 1973 Stemme USP 3,747,120 Epson Stylus Tektronix IJ04 |
| Electro-strictive | An electric field is used to activate electrostriction in relaxor materials such as lead lanthanum zirconate titanate (PLZT) or lead magnesium niobate (PMN). | Low power consumption Many ink types can be used Low thermal expansion Electric field strength required (approx. 3.5 V/$\mu$m) can be generated without difficulty Does not require electrical poling | Low maximum strain (approx. 0.01%) Large area required for actuator due to low strain Response speed is marginal (~10 $\mu$s) High voltage drive transistors required Full pagewidth print heads impractical due to actuator size | Seiko Epson, Usui et all JP 253401/96 IJ04 |
| Ferro-electric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | Low power consumption Many ink types can be used Fast operation (<1 $\mu$s) Relatively high longitudinal strain High efficiency Electric field strength of around 3 V/$\mu$m can be readily provided | Difficult to integrate with electronics Unusual materials such as PLZSnT are required Actuators require a large area | IJ04 |
| Electro-static plates | Conductive plates are separated by a compressible or fluid dielectric (usually air). Upon application of a voltage, the plates attract each other and displace ink, causing drop ejection. The conductive plates may be in a comb or honeycomb structure, or stacked to increase the surface area and therefore the force. | Low power consumption Many ink types can be used Fast operation | Difficult to operate electrostatic devices in an aqueous environment The electrostatic actuator will normally need to be separated from the ink Very large area required to achieve high forces High voltage drive transistors may be required | IJ02, IJ04 |

-continued

ACTUATOR MECHANISM (APPLIED ONLY TO SELECTED INK DROPS)

| | Description | Advantages | Disadvantages | Examples |
|---|---|---|---|---|
| Electro-static pull on ink | A strong electric field is applied to the ink, whereupon electrostatic attraction accelerates the ink towards the print medium. | Low current consumption Low temperature | Full pagewidth print heads are not competitive due to actuator size High voltage required May be damaged by sparks due to air breakdown Required field strength increases as the drop size decreases High voltage drive transistors required Electrostatic field attracts dust | 1989 Saito et al, USP 4,799,068 1989 Miura et al, USP 4,810,954 Tone-jet |
| Permanent magnet electro-magnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc) | Low power consumption Many ink types can be used Fast operation High efficiency Easy extension from single nozzles to pagewidth print heads | Complex fabrication Permanent magnetic material such as Neodymium Iron Boron (NdFeB) required. High local currents required Copper metalization should be used for long electromigration lifetime and low resistivity Pigmented inks are usually infeasible Operating temperature limited to the Curie temperature (around 540 K) | IJ07, IJ10 |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | Low power consumption Many ink types can be used Fast operation High efficiency Easy extension from single nozzles to pagewidth print heads | Complex fabrication Materials not usually present in a CMOS fab such as NiFe, CoNiFe, or CoFe are required High local currents required Copper metalization should be used for long electromigration lifetime and low resistivity Electroplating is required High saturation flux density is required (2.0–2.1 T is achievable with CoNiFe [1]) | IJ01, IJ05, IJ08, IJ10, IJ12, IJ14, IJ15, IJ17 |
| Lorenz force | The Lorenz force acting on a current carrying wire in a magnetic field is utilized. This allows the magnetic field to be supplied externally to the print head, for example with rare earth permanent magnets. | Low power consumption Many ink types can be used Fast operation High efficiency Easy extension from single nozzles to pagewidth print heads | Force acts as a twisting motion Typically, only a quarter of the solenoid length provides force in a useful direction High local currents required Copper metalization should be used for long | IJ06, IJ11, IJ13, IJ16 |

-continued

ACTUATOR MECHANISM (APPLIED ONLY TO SELECTED INK DROPS)

| | Description | Advantages | Disadvantages | Examples |
|---|---|---|---|---|
| | Only the current carrying wire need be fabricated on the printhead, simplifying materials requirements. | | electromigration lifetime and low resistivity Pigmented inks are usually infeasible | |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | Many ink types can be used Fast operation Easy extension from single nozzles to pagewidth print heads High force is available | Force acts as a twisting motion Unusual materials such as Terfenol-D are required High local currents required Copper metalization should be used for long electromigration lifetime and low resistivity Pre-stressing may be required | Fischenbeck, USP 4,032,929 IJ25 |
| Surface tension reduction | Ink under positive pressure is held in a nozzle by surface tension. The surface tension of the ink is reduced below the bubble threshold, causing the ink to egress from the nozzle. | Low power consumption Simple construction No unusual materials required in fabrication High efficiency Easy extension from single nozzles to pagewidth print heads | Requires supplementary force to effect drop separation Requires special ink surfactants Speed may be limited by surfactant properties | Silverbrook, EP 0771 658 A2 and related patent applications |
| Viscosity reduction | The ink viscosity is locally reduced to select which drops are to be ejected. A viscosity reduction can be achieved electrothermally with most inks, but special inks can be engineered for a 100:1 viscosity reduction. | Simple construction No unusual materials required in fabrication Easy extension from single nozzles to pagewidth print heads | Requires supplementary force to effect drop separation Requires special ink viscosity properties High speed is difficult to achieve Requires oscillating ink pressure A high temperature difference (typically 80 degrees) is required | Silverbrook, EP 0771 658 A2 and related patent applications |
| Acoustic | An acoustic wave is generated and focussed upon the drop ejection region. | Can operate without a nozzle plate | Complex drive circuitry Complex fabrication Low efficiency Poor control of drop position Poor control of drop volume | 1993 Hadimioglu et al, EUP 550,192 1993 Elrod et al, EUP 572,220 |
| Thermo-elastic bend actuator | An actuator which relies upon differential thermal expansion upon Joule heating is used. | Low power consumption Many ink types can be used Simple planar fabrication Small chip area required for each actuator Fast operation High efficiency CMOS compatible voltages and currents Standard MEMS processes can be | Efficient aqueous operation requires a thermal insulator on the hot side Corrosion prevention can be difficult Pigmented inks may be infeasible, as pigment particles may jam the bend actuator | IJ03, IJ09, IJ17, IJ18, IJ19, IJ20, IJ21, IJ22, IJ23, IJ24, IJ27, IJ28, IJ29, IJ30, IJ31, IJ32, IJ33, IJ34, IJ35, IJ36, IJ37, IJ38, IJ39, IJ40, IJ41 |

-continued

ACTUATOR MECHANISM (APPLIED ONLY TO SELECTED INK DROPS)

| | Description | Advantages | Disadvantages | Examples |
|---|---|---|---|---|
| | | used<br>Easy extension from single nozzles to pagewidth print heads | | |
| High CTE thermo-elastic actuator | A material with a very high coefficient of thermal expansion (CTE) such as polytetrafluoroethylene (PTFE) is used. As high CTE materials are usually non-conductive, a heater fabricated from a conductive material is incorporated. A 50 μm long PTFE bend actuator with polysilicon heater and 15 mW power input can provide 180 μN force and 10 μm deflection. Actuator motions include:<br>Bend<br>Push<br>Buckle<br>Rotate | High force can be generated<br>Three methods of PTFE deposition are under development: chemical vapor deposition (CVD), spin coating, and evaporation<br>PTFE is a candidate for low dielectric constant insulation in ULSI<br>Very low power consumption<br>Many ink types can be used<br>Simple planar fabrication<br>Small chip area required for each actuator<br>Fast operation<br>High efficiency<br>CMOS compatible voltages and currents<br>Easy extension from single nozzles to pagewidth print heads | Requires special material (e.g. PTFE)<br>Requires a PTFE deposition process, which is not yet standard in ULSI fabs<br>PTFE deposition cannot be followed with high temperature (above 350° C.) processing<br>Pigmented inks may be infeasible, as pigment particles may jam the bend actuator | IJ09, IJ17, IJ18, IJ20, IJ21, IJ22, IJ23, IJ24, IJ27, IJ28, IJ29, IJ30, IJ31, IJ42, IJ43, IJ44 |
| Conductive polymer thermo-elastic actuator | A polymer with a high coefficient of thermal expansion (such as PTFE) is doped with conducting substances to increase its conductivity to about 3 orders of magnitude below that of copper. The conducting polymer expands when resistively heated. Examples of conducting dopants include:<br>Carbon nanotubes<br>Metal fibers<br>Conductive polymers such as doped polythiophene<br>Carbon granules | High force can be generated<br>Very low power consumption<br>Many ink types can be used<br>Simple planar fabrication<br>Small chip area required for each actuator<br>Fast operation<br>High efficiency<br>CMOS compatible voltages and currents<br>Easy extension from single nozzles to pagewidth print heads | Requires special materials development (High CTE conductive polymer)<br>Requires a PTFE deposition process, which is not yet standard in ULSI fabs<br>PTFE deposition cannot be followed with high temperature (above 350° C.) processing<br>Evaporation and CVD deposition techniques cannot be used<br>Pigmented inks may be infeasible, as pigment particles may jam the bend actuator | IJ24 |
| Shape memory alloy | A shape memory alloy such as TiNi (also known as Nitinol-Nickel Titanium alloy developed at the Naval Ordnance Laboratory) is thermally switched between its weak martensitic state and its high stiffness austenic state. The shape of the actuator in its martensitic state is deformed relative to the austenic shape. | High force is available (stresses of hundreds of MPa)<br>Large strain is available (more than 3%)<br>High corrosion resistance<br>Simple construction<br>Easy extension from single nozzles to pagewidth print heads<br>Low voltage | Fatigue limits maximum number of cycles<br>Low strain (1%) is required to extend fatigue resistance<br>Cycle rate limited by heat removal<br>Requires unusual materials (TiNi)<br>The latent heat of transformation must be provided<br>High current operation | IJ26 |

-continued

ACTUATOR MECHANISM (APPLIED ONLY TO SELECTED INK DROPS)

| | Description | Advantages | Disadvantages | Examples |
|---|---|---|---|---|
| Linear Magnetic Actuator | The shape change causes ejection of a drop. Linear magnetic actuators include the Linear Induction Actuator (LIA), Linear Permanent Magnet Synchronous Actuator (LPMSA), Linear Reluctance Synchronous Actuator (LRSA), Linear Switched Reluctance Actuator (LSRA), and the Linear Stepper Actuator (LSA). | operation Linear Magnetic actuators can be constructed with high thrust, long travel, and high efficiency using planar semiconductor fabrication techniques Long actuator travel is available Medium force is available Low voltage operation | Requires pre-stressing to distort the martensitic state Requires unusual semiconductor materials such as soft magnetic alloys (e.g. CoNiFe) Some varieties also require permanent magnetic materials such as Neodymium iron boron (NdFeB) Requires complex multi-phase drive circuitry High current operation | IJ12 |

| | Description | Advantages | Disadvantages | Examples |
|---|---|---|---|---|
| | | BASIC OPERATION MODE | | |
| Actuator directly pushes ink | This is the simplest mode of operation: the actuator directly supplies sufficient kinetic energy to expel the drop. The drop must have a sufficient velocity to overcome the surface tension. | Simple operation No external fields required Satellite drops can be avoided if drop velocity is less than 4 m/s Can be efficient, depending upon the actuator used | Drop repetition rate is usually limited to around 10 kHz. However, this is not fundamental to the method, but is related to the refill method normally used All of the drop kinetic energy must be provided by the actuator Satellite drops usually form if drop velocity is greater than 4.5 m/s | Thermal ink jet Piezoelectric ink jet IJ01, IJ02, IJ03, IJ04, IJ05, IJ06, IJ07, IJ09, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Proximity | The drops to be printed are selected by some manner (e.g. thermally induced surface tension reduction of pressurized ink). Selected drops are separated from the ink in the nozzle by contact with the print medium or a transfer roller. | Very simple print head fabrication can be used The drop selection means does not need to provide the energy required to separate the drop from the nozzle | Requires close proximity between the print head and the print media or transfer roller May require two print heads printing alternate rows of the image Monolithic color print heads are difficult | Silverbrook, EP 0771 658 A2 and related patent applications |
| Electrostatic pull on ink | The drops to be printed are selected by some manner (e.g. thermally induced surface tension reduction of pressurized ink). Selected drops are separated from the ink in the nozzle by a strong electric field. | Very simple print head fabrication can be used The drop selection means does not need to provide the energy required to separate the drop from the nozzle | Requires very high electrostatic field Electrostatic field for small nozzle sizes is above air breakdown Electrostatic field may attract dust | Silverbrook, EP 0771 658 A2 and related patent applications Tone-Jet |
| Magnetic pull on ink | The drops to be printed are selected by some manner (e.g. thermally induced surface tension | Very simple print head fabrication can be used The drop selection means | Requires magnetic ink Ink colors other than black are difficult | Silverbrook, EP 0771 658 A2 and related patent applications |

-continued

|  | Description | Advantages | Disadvantages | Examples |
|---|---|---|---|---|
|  | reduction of pressurized ink). Selected drops are separated from the ink in the nozzle by a strong magnetic field acting on the magnetic ink. | does not need to provide the energy required to separate the drop from the nozzle | Requires very high magnetic fields |  |
| Shutter | The actuator moves a shutter to block ink flow to the nozzle. The ink pressure is pulsed at a multiple of the drop ejection frequency. | High speed (>50 kHz) operation can be achieved due to reduced refill time Drop timing can be very accurate The actuator energy can be very low | Moving parts are required Requires ink pressure modulator Friction and wear must be considered Stiction is possible | IJ13, IJ17, IJ21 |
| Shuttered grill | The actuator moves a shutter to block ink flow through a grill to the nozzle. The shutter movement need only be equal to the width of the grill holes. | Actuators with small travel can be used Actuators with small force can be used High speed (>50 kHz) operation can be achieved | Moving parts are required Requires ink pressure modulator Friction and wear must be considered Stiction is possible | IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | Extremely low energy operation is possible No heat dissipation problems | Requires an external pulsed magnetic field Requires special materials for both the actuator and the ink pusher Complex construction | IJ10 |
|  |  | AUXILIARY MECHANISM (APPLIED TO ALL NOZZLES) |  |  |
| None | The actuator directly fires the ink drop, and there is no external field or other mechanism required. | Simplicity of construction Simplicity of operation Small physical size | Drop ejection energy must be supplied by individual nozzle actuator | Most ink jets, including piezoelectric and thermal bubble. IJ01, IJ02, IJ03, IJ04, IJ05, IJ07, IJ09, IJ11, IJ12, IJ14, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by vibrating the print head, or preferably by an actuator in the ink supply. | Oscillating ink pressure can provide a refill pulse, allowing higher operating speed The actuators may operate with much lower energy Acoustic lenses can be used to focus the sound on the nozzles | Requires external ink pressure oscillator Ink pressure phase and amplitude must be carefully controlled Acoustic reflections in the ink chamber must be designed for | Silverbrook, EP 0771 658 A2 and related patent applications IJ08, IJ13, IJ15, IJ17, IJ18, IJ19, IJ21 |
| Media proximity | The print head is placed in close proximity to the print medium. Selected drops protrude from the print head further than unselected drops, and contact the print medium. The drop | Low power High accuracy Simple print head construction | Precision assembly required Paper fibers may cause problems Cannot print on rough substrates | Silverbrook, EP 0771 658 A2 and related patent applications |

-continued

| | Description | Advantages | Disadvantages | Examples |
|---|---|---|---|---|
| | soaks into the medium fast enough to cause drop separation. | | | |
| | | BASIC OPERATION MODE | | |
| Transfer roller | Drops are printed to a transfer roller instead of straight to the print medium. A transfer roller can also be used for proximity drop separation. | High accuracy Wide range of print substrates can be used Ink can be dried on the transfer roller | Bulky Expensive Complex construction | Silverbrook, EP 0771 658 A2 and related patent applications Tektronix hot melt piezoelectric inkjet Any of the IJ series |
| Electro-static | An electric field is used to accelerate selected drops towards the print medium. | Low power Simple print head construction | Field strength required for separation of small drops is near or above air breakdown | Silverbrook, EP 0771 658 A2 and related patent applications Tone-Jet |
| Direct magnetic field | A magnetic field is used to accelerate selected drops of magnetic ink towards the print medium. | Low power Simple print head construction | Requires magnetic ink Requires strong magnetic field | Silverbrook, EP 0771 658 A2 and related patent applications |
| Cross magnetic field | The print head is placed in a constant magnetic field. The Lorenz force in a current carrying wire is used to move the actuator. | Does not require magnetic materials to be integrated in the print head manufacturing process | Requires external magnet Current densities may be high, resulting in electromigration problems | IJ06, IJ16 |
| Pulsed magnetic field | A pulsed magnetic field is used to cyclically attract a paddle, which pushes on the ink. A small actuator moves a catch, which selectively prevents the paddle from moving. | Very low power operation is possible Small print head size | Complex print head construction Magnetic materials required in print head | IJ10 |

| | ACTUATOR AMPLIFICATION OR MODIFICATION METHOD | | | |
|---|---|---|---|---|
| | Description | Advantages | Disadvantages | Examples |
| None | No actuator mechanical amplification is used. The actuator directly drives the drop ejection process. | Operational simplicity | Many actuator mechanisms have insufficient travel, or insufficient force, to efficiently drive the drop ejection process | Thermal Bubble Ink jet IJ01, IJ02, IJ06, IJ07, IJ16, IJ25, IJ26 |
| Differential expansion bend actuator | An actuator material expands more on one side than on the other. The expansion may be thermal, piezoelectric, magnetostrictive, or other mechanism. The bend actuator converts a high force low travel actuator mechanism to high travel, lower force mechanism. | Provides greater travel in a reduced print head area | High stresses are involved Care must be taken that the materials do not delaminate Residual bend resulting from high temperature or high stress during formation | Piezoelectric IJ03, IJ09, IJ17, IJ18, IJ19, IJ20, IJ21, IJ22, IJ23, IJ24, IJ27, IJ29, IJ30, IJ31, IJ32, IJ33, IJ34, IJ35, IJ36, IJ37, IJ38, IJ39, IJ42, IJ43, IJ44 |
| Transient bend actuator | A trilayer bend actuator where the two outside layers are identical. This cancels bend due to ambient temperature and | Very good temperature stability High speed, as a new drop can be fired before heat dissipates | High stresses are involved Care must be taken that the materials do not delaminate | IJ40, IJ41 |

-continued

ACTUATOR AMPLIFICATION OR MODIFICATION METHOD

| | Description | Advantages | Disadvantages | Examples |
|---|---|---|---|---|
| | residual stress. The actuator only responds to transient heating of one side or the other. | Cancels residual stress of formation | | |
| Reverse spring | The actuator loads a spring. When the actuator is turned off, the spring releases. This can reverse the force/distance curve of the actuator to make it compatible with the force/time requirements of the drop ejection. | Better coupling to the ink | Fabrication complexity High stress in the spring | IJ05, IJ11 |
| Actuator stack | A series of thin actuators are stacked. This can be appropriate where actuators require high electric field strength, such as electrostatic and piezoelectric actuators. | Increased travel Reduced drive voltage | Increased fabrication complexity Increased possibility of short circuits due to pinholes | Some piezoelectric ink jets IJ04 |
| Multiple actuators | Multiple smaller actuators are used simultaneously to move the ink. Each actuator need provide only a portion of the force required. | Increases the force available from an actuator Multiple actuators can be positioned to control ink flow accurately | Actuator forces may not add linearly, reducing efficiency | IJ12, IJ13, IJ18, IJ20, IJ22, IJ28, IJ42, IJ43 |
| Linear Spring | A linear spring is used to transform a motion with small travel and high force into a longer travel, lower force motion. | Matches low travel actuator with higher travel requirements Non-contact method of motion transformation | Requires print head area for the spring | IJ15 |
| Coiled actuator | A bend actuator is coiled to provide greater travel in a reduced chip area. | Increases travel Reduces chip area Planar implementations are relatively easy to fabricate. | Generally restricted to planar implementations due to extreme fabrication difficulty in other orientations. | IJ17, IJ21, IJ34, IJ35 |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip. | Simple means of increasing travel of a bend actuator | Care must be taken not to exceed the elastic limit in the flexure area Stress distribution is very uneven Difficult to accurately model with finite element analysis | IJ10, IJ19, IJ33 |
| Catch | The actuator controls a small catch. The catch either enables or disables movement of an ink pusher that is controlled in a bulk manner. | Very low actuator energy Very small actuator size | Complex construction Requires external force Unsuitable for pigmented inks | IJ10 |
| Gears | Gears can be used to increase travel at the expense of duration. Circular gears, rack and pinion, ratchets, and other gearing methods can be used. | Low force, low travel actuators can be used Can be fabricated using standard surface MEMS processes | Moving parts are required Several actuator cycles are required More complex drive electronics Complex construction Friction, friction, and wear are possible | IJ13 |

-continued

ACTUATOR AMPLIFICATION OR MODIFICATION METHOD

| | Description | Advantages | Disadvantages | Examples |
|---|---|---|---|---|
| Buckle plate | A buckle plate can be used to change a slow actuator into a fast motion. It can also convert a high force, low travel actuator into a high travel, medium force motion. | Very fast movement achievable | Must stay within elastic limits of the materials for long device life High stresses involved Generally high power requirement | S. Hirata et al, "An Ink-jet Head Using Diaphragm Microactuator", Proc. IEEE MEMS, Feb. 1996, pp 418–423. IJ18, IJ27 |
| Tapered magnetic pole | A tapered magnetic pole can increase travel at the expense of force. | Linearizes the magnetic force/distance curve | Complex construction | IJ14 |
| Lever | A lever and fulcrum is used to transform a motion with small travel and high force into a motion with longer travel and lower force. The lever can also reverse the direction of travel. | Matches low travel actuator with higher travel requirements Fulcrum area has no linear movement, and can be used for a fluid seal | High stress around the fulcrum | IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | High mechanical advantage The ratio of force to travel of the actuator can be matched to the nozzle requirements by varying the number of impeller vanes | Complex construction Unsuitable for pigmented inks | IJ28 |
| Acoustic lens | A refractive or diffractive (e.g. zone plate) acoustic lens is used to concentrate sound waves. | No moving parts | Large area required Only relevant for acoustic ink jets | 1993 Hadimioglu et al, EUP 550,192 1993 Elrod et al, EUP 572,220 |
| Sharp conductive point | A sharp point is used to concentrate an electrostatic field. | Simple construction | Difficult to fabricate using standard VLSI processes for a surface ejecting ink-jet Only relevant for electrostatic ink jets | Tone-jet |

ACTUATOR MOTION

| | Description | Advantages | Disadvantages | Examples |
|---|---|---|---|---|
| Volume expansion | The volume of the actuator changes, pushing the ink in all directions. | Simple construction in the case of thermal ink jet | High energy is typically required to achieve volume expansion. This leads to thermal stress, cavitation, and kogation in thermal ink jet implementations | Hewlett-Packard Thermal Ink jet Canon Bubblejet |
| Linear, normal to chip surface | The actuator moves in a direction normal to the print head surface. The nozzle is typically in the line of movement. | Efficient coupling to ink drops ejected normal to the surface | High fabrication complexity may be required to achieve perpendicular motion | IJ01, IJ02, IJ04, IJ07, IJ11, IJ14 |
| Parallel to chip surface | The actuator moves parallel to the print head surface. Drop ejection may still be normal to the surface. | Suitable for planar fabrication | Fabrication complexity Friction Stiction | IJ12, IJ13, IJ15, IJ33, IJ34, IJ35, IJ36 |

-continued

ACTUATOR MOTION

| | Description | Advantages | Disadvantages | Examples |
|---|---|---|---|---|
| Membrane push | An actuator with a high force but small area is used to push a stiff membrane that is in contact with the ink. | The effective area of the actuator becomes the membrane area | Fabrication complexity Actuator size Difficulty of integration in a VLSI process | 1982 Howkins U.S. Pat. No. 4,459,601 |
| Rotary | The actuator causes the rotation of some element, such a grill or impeller | Rotary levers may be used to increase travel Small chip area requirements | Device complexity May have friction at a pivot point | IJ05, IJ08, IJ13, IJ28 |
| Bend | The actuator bends when energized. This may be due to differential thermal expansion, piezoelectric expansion, magnetostriction, or other form of relative dimensional change. | A very small change in dimensions can be converted to a large motion. | Requires the actuator to be made from at least two distinct layers, or to have a thermal difference across the actuator | 1970 Kyser et al U.S. Pat. No. 3,946,398 1973 Stemme U.S. Pat. No. 3,747,120 IJ03, IJ09, IJ10, IJ19, IJ23, IJ24, IJ25, IJ29, IJ30, IJ31, IJ33, IJ34, IJ35 |
| Swivel | The actuator swivels around a central pivot. This motion is suitable where there are opposite forces applied to opposite sides of the paddle, e.g. Lorenz force. | Allows operation where the net linear force on the paddle is zero Small chip area requirements | Inefficient coupling to the ink motion | IJ06 |
| Straighten | The actuator is normally bent, and straightens when energized. | Can be used with shape memory alloys where the austenic phase is planar | Requires careful balance of stresses to ensure that the quiescent bend is accurate | IJ26, IJ32 |
| Double bend | The actuator bends in one direction when one element is energized, and bends the other way when another element is energized. | One actuator can be used to power two nozzles. Reduced chip size. Not sensitive to ambient temperature | Difficult to make the drops ejected by both bend directions identical. A small efficiency loss compared to equivalent single bend actuators. | IJ36, IJ37, IJ38 |
| Shear | Energizing the actuator causes a shear motion in the actuator material. | Can increase the effective travel of piezoelectric actuators | Not readily applicable to other actuator mechanisms | 1985 Fishbeck U.S. Pat. No. 4,584,590 |
| Radial constriction | The actuator squeezes an ink reservoir, forcing ink from a constricted nozzle. | Relatively easy to fabricate single nozzles from glass tubing as macroscopic structures | High force required Inefficient Difficult to integrate with VLSI processes | 1970 Zoltan U.S. Pat. No. 3,683,212 |
| Coil/ uncoil | A coiled actuator uncoils or coils more tightly. The motion of the free end of the actuator ejects the ink. | Easy to fabricate as a planar VLSI process Small area required, therefore low cost | Difficult to fabricate for non-planar devices Poor out-of-plane stiffness | IJ17, IJ21, IJ34, IJ35 |
| Bow | The actuator bows (or buckles) in the middle when energized. | Can increase the speed of travel Mechanically rigid | Maximum travel is constrained High force required | IJ16, IJ18, IJ27 |
| Push-Pull | Two actuators control a shutter. One actuator pulls the shutter, and the other pushes it. | The structure is pinned at both ends, so has a high out-of-plane rigidity | Not readily suitable for ink jets which directly push the ink | IJ18 |
| Curl inwards | A set of actuators curl inwards to reduce the volume of ink that they enclose. | Good fluid flow to the region behind the actuator increases efficiency | Design complexity | IJ20, IJ42 |
| Curl outwards | A set of actuators curl outwards, pressurizing ink in a chamber surrounding the actuators, and | Relatively simple construction | Relatively large chip area | IJ43 |

-continued

ACTUATOR MOTION

| | Description | Advantages | Disadvantages | Examples |
|---|---|---|---|---|
| | expelling ink from a nozzle in the chamber. | | | |
| Iris | Multiple vanes enclose a volume of ink. These simultaneously rotate, reducing the volume between the vanes | High efficiency Small chip area | High fabrication complexity Not suitable for pigmented inks | IJ22 |
| Acoustic vibration | The actuator vibrates at a high frequency. | The actuator can be physically distant from the ink | Large area required for efficient operation at useful frequencies Acoustic coupling and crosstalk Complex drive circuitry Poor control of drop volume and position | 1993 Hadimioglu et al, EUP 550,192 1993 Elrod et al, EUP 572,220 |
| None | In various ink jet designs the actuator does not move. | No moving parts | Various other tradeoffs are required to eliminate moving parts | Silverbrook, EP 0771 658 A2 and related patent applications Tone-jet |

NOZZLE REFILL METHOD

| | Description | Advantages | Disadvantages | Examples |
|---|---|---|---|---|
| Surface tension | This is the normal way that ink jets are refilled. After the actuator is energized, it typically returns rapidly to its normal position. This rapid return sucks in air through the nozzle opening. The ink surface tension at the nozzle then exerts a small force restoring the meniscus to a minimum area. This force refills the nozzle. | Fabrication simplicity Operational simplicity | Low speed Surface tension force relatively small compared to actuator force Long refill time usually dominates the total repetition rate | Thermal ink jet Piezoelectric ink jet IJ01–IJ07, IJ10– IJ14, IJ16, IJ20, IJ22–IJ45 |
| Shuttered oscillating ink pressure | Ink to the nozzle chamber is provided at a pressure that oscillates at twice the drop ejection frequency. When a drop is to be ejected, the shutter is opened for 3 half cycles: drop ejection, actuator return, and refill. The shutter is then closed to prevent the nozzle chamber emptying during the next negative pressure cycle. | High speed Low actuator energy, as the actuator need only open or close the shutter, instead of ejecting the ink drop | Requires common ink pressure oscillator May not be suitable for pigmented inks | IJ08, IJ13, IJ15, IJ17, IJ18, IJ19, IJ21 |
| Refill actuator | After the main actuator has ejected a drop a second (refill) actuator is energized. The refill actuator pushes ink into the nozzle chamber. The refill actuator returns slowly, to prevent its | High speed, as the nozzle is actively refilled | Requires two independent actuators per nozzle | IJ09 |

-continued

NOZZLE REFILL METHOD

|  | Description | Advantages | Disadvantages | Examples |
|---|---|---|---|---|
| Positive ink pressure | return from emptying the chamber again. The ink is held a slight positive pressure. After the ink drop is ejected, the nozzle chamber fills quickly as surface tension and ink pressure both operate to refill the nozzle. | High refill rate, therefore a high drop repetition rate is possible<br><br>IJ14, IJ16, IJ20, IJ22–IJ45 | Surface spill must be prevented Highly hydrophobic print head surfaces are required | Silverbrook, EP 0771 658 A2 and related patent applications Alternative for:, IJ01–IJ07, IJ10– |

METHOD OF RESTRICTING BACK-FLOW THROUGH INLET

|  | Description | Advantages | Disadvantages | Examples |
|---|---|---|---|---|
| Long inlet channel | The ink inlet channel to the nozzle chamber is made long and relatively narrow, relying on viscous drag to reduce inlet back-flow. | Design simplicity Operational simplicity Reduces crosstalk | Restricts refill rate May result in a relatively large chip area Only partially effective | Thermal ink jet Piezoelectric ink jet IJ42, IJ43 |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out through the inlet. | Drop selection and separation forces can be reduced Fast refill time | Requires a method (such as a nozzle rim or effective hydrophobizing, or both) to prevent flooding of the ejection surface of the print head. | Silverbrook, EP 0771 658 A2 and related patent applications Possible operation of the following: IJ01–IJ07, IJ09–IJ12, IJ14, IJ16, IJ20, IJ22, IJ23–IJ34, IJ36–IJ41, IJ44 |
| Baffle | One or more baffles are placed in the inlet ink flow. When the actuator is energized, the rapid ink movement creates eddies which restrict the flow through the inlet. The slower refill process is unrestricted, and does not result in eddies. | The refill rate is not as restricted as the long inlet method. Reduces crosstalk | Design complexity May increase fabrication complexity (e.g. Tektronix hot melt Piezoelectric print heads). | HP Thermal Ink Jet Tektronix piezoelectric ink jet |
| Flexible flap restricts inlet | In this method recently disclosed by Canon, the expanding actuator (bubble) pushes on a flexible flap that restricts the inlet. | Significantly reduces back-flow for edge-shooter thermal ink jet devices | Not applicable to most ink jet configurations Increased fabrication complexity Inelastic deformation of polymer flap results in creep over extended use | Canon |
| Inlet filter | A filter is located between the ink inlet and the nozzle chamber. The filter has a multitude of small holes or slots, restricting ink flow. The filter also removes | Additional advantage of ink filtration Ink filter may be fabricated with no additional process steps | Restricts refill rate May result in complex construction | IJ04, IJ12, IJ24, IJ27, IJ29, IJ30 |

-continued

METHOD OF RESTRICTING BACK-FLOW THROUGH INLET

| | Description | Advantages | Disadvantages | Examples |
|---|---|---|---|---|
| Small inlet compared to nozzle | particles which may block the nozzle. The ink inlet channel to the nozzle chamber has a substantially smaller cross section than that of the nozzle resulting in easier ink egress out of the nozzle than out of the inlet. | Design simplicity | Restricts refill rate May result in a relatively large chip area Only partially effective | IJ02, IJ37, IJ44 |
| Inlet shutter | A secondary actuator controls the position of a shutter, closing off the ink inlet when the main actuator is energized. | Increases speed of the ink-jet print head operation | Requires separate refill actuator and drive circuit | IJ09 |
| The inlet is located behind the ink-pushing surface | The method avoids the problem of inlet back-flow by arranging the ink-pushing surface of the actuator between the inlet and the nozzle. | Back-flow problem is eliminated | Requires careful design to minimize the negative pressure behind the paddle | IJ01, IJ03, IJ05, IJ06, IJ07, IJ10, IJ11, IJ14, IJ16, IJ22, IJ23, IJ25, IJ28, IJ31, IJ32, IJ33, IJ34, IJ35, IJ36, IJ39, IJ40, IJ41 |
| Part of the actuator moves to shut off the inlet | The actuator and a wall of the ink chamber are arranged so that the motion of the actuator closes off the inlet. | Significant reductions in back-flow can be achieved Compact designs possible | Small increase in fabrication complexity | IJ07, IJ20, IJ26, IJ38 |
| Nozzle actuator does not result in ink back-flow | In some configurations of ink jet, there is no expansion or movement of an actuator which may cause ink back-flow through the inlet. | Ink back-flow problem is eliminated | None related to ink back-flow on actuation | Silverbrook, EP 0771 658 A2 and related patent applications Valve-jet Tone-jet |

NOZZLE CLEARING METHOD

| | Description | Advantages | Disadvantages | Examples |
|---|---|---|---|---|
| Normal nozzle firing | All of the nozzles are fired periodically, before the ink has a chance to dry. When not in use the nozzles are sealed (capped) against air. The nozzle firing is usually performed during a special clearing cycle, after first moving the print head to a cleaning station. | No added complexity on the print head | May not be sufficient to displace dried ink | Most ink jet systems IJ01, IJ02, IJ03, IJ04, IJ05, IJ06, IJ07, IJ09, IJ10, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ36, IJ37, IJ38, IJ39, IJ40,, IJ41, IJ42, IJ43, IJ44,, IJ45 |
| Extra power to ink heater | In systems which heat the ink, but do not boil it under normal situations, nozzle clearing can be achieved by over-powering the heater and boiling ink at the nozzle. | Can be highly effective if the heater is adjacent to the nozzle | Requires higher drive voltage for clearing May require larger drive transistors | Silverbrook, EP 0771 658 A2 and related patent applications |
| Rapid succession of | The actuator is fired in rapid succession. In some configurations, | Does not require extra drive circuits on the print head | Effectiveness depends substantially upon | May be used with: IJ01, IJ02, IJ03, IJ04, IJ05, IJ06, |

-continued

NOZZLE CLEARING METHOD

| | Description | Advantages | Disadvantages | Examples |
|---|---|---|---|---|
| actuator pulses | this may cause heat build-up at the nozzle which boils the ink, clearing the nozzle. In other situations, it may cause sufficient vibrations to dislodge clogged nozzles. | Can be readily controlled and initiated by digital logic | the configuration of the ink jet nozzle | IJ07, IJ09, IJ10, IJ11, IJ14, IJ16, IJ20, IJ22, IJ23, IJ24, IJ25, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink pushing actuator | Where an actuator is not normally driven to the limit of its motion, nozzle clearing may be assisted by providing an enhanced drive signal to the actuator. | A simple solution where applicable | Not suitable where there is a hard limit to actuator movement | May be used with: IJ03, IJ09, IJ16, IJ20, IJ23, IJ24, IJ25, IJ27, IJ29, IJ30, IJ31, IJ32, IJ39, IJ40, IJ41, IJ42, IJ43, IJ44, IJ45 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity | A high nozzle clearing capability can be achieved May be implemented at very low cost in systems which already include acoustic actuators | High implementation cost if system does not already include an acoustic actuator | IJ08, IJ13, IJ15, IJ17, IJ18, IJ19, IJ21 |
| Nozzle clearing plate | A microfabricated plate is pushed against the nozzles. The plate has a post for every nozzle. A post moves through each nozzle, displacing dried ink. | Can clear severely clogged nozzles | Accurate mechanical alignment is required Moving parts are required There is risk of damage to the nozzles Accurate fabrication is required | Silverbrook, EP 0771 658 A2 and related patent applications |
| Ink pressure pulse | The pressure of the ink is temporarily increased so that ink streams from all of the nozzles. This may be used in conjunction with actuator energizing. | May be effective where other methods cannot be used | Requires pressure pump or other pressure actuator Expensive Wasteful of ink | May be used with all IJ series ink jets |
| Print head wiper | A flexible 'blade' is wiped across the print head surface. The blade is usually fabricated from a flexible polymer, e.g. rubber or synthetic elastomer. | Effective for planar print head surfaces Low cost | Difficult to use if print head surface is non-planar or very fragile Requires mechanical parts Blade can wear out in high volume print systems | Many ink jet systems |
| Separate ink boiling heater | A separate heater is provided at the nozzle although the normal drop e-ection mechanism does not require it. The beaters do not require individual drive circuits, as many nozzles can be cleared simultaneously, and no imaging is required. | Can be effective where other nozzle clearing methods cannot be used Can be implemented at no additional cost in some ink jet configurations | Fabrication complexity | Can be used with many IJ series ink jets |

| NOZZLE PLATE CONSTRUCTION | | | | |
| --- | --- | --- | --- | --- |
| | Description | Advantages | Disadvantages | Examples |
| Electro-formed nickel | A nozzle plate is separately fabricated from electroformed nickel, and bonded to the print head chip. | Fabrication simplicity | High temperatures and pressures are required to bond nozzle plate Minimum thickness constraints Differential thermal expansion | Hewlett Packard Thermal Ink jet |
| Laser ablated or drilled polymer | Individual nozzle holes are ablated by an intense UV laser in a nozzle plate, which is typically a polymer such as polyimide or polysulphone | No masks required Can be quite fast Some control over nozzle profile is possible Equipment required is relatively low cost | Each hole must be individually formed Special equipment required Slow where there are many thousands of nozzles per print head May produce thin burrs at exit holes | Canon Bubblejet 1988 Sercel et al., SPIE, Vol. 998 Excimer Beam Applications, pp. 76–83 1993 Watanabe et al., USP 5,208,604 |
| Silicon micro-machined | A separate nozzle plate is micromachined from single crystal silicon, and bonded to the print head wafer. | High accuracy is attainable | Two part construction High cost Requires precision alignment Nozzles may be clogged by adhesive | K. Bean, IEEE Transactions on Electron Devices, Vo. ED-25, No. 10, 1978, pp 1185–1195 Xerox 1990 Hawkins et al., USP 4,899,181 |
| Glass capillaries | Fine glass capillaries are drawn from glass tubing. This method has been used for making individual nozzles, but is difficult to use for bulk manufacturing of print heads with thousands of nozzles. | No expensive equipment required Simple to make single nozzles | Very small nozzle sizes are difficult to form Not suited for mass production | 1970 Zoltan USP 3,683,212 |
| Monolithic, surface micro-machined using VLSI lithographic processes | The nozzle plate is deposited as a layer using standard VLSI deposition techniques. Nozzles are etched in the nozzle plate using VLSI lithography and etching. | High accuracy (<1 $\mu$m) Monolithic Low cost Existing processes can be used | Requires sacrificial layer under the nozzle plate to form the nozzle chamber Surface may be fragile to the touch | Silverbrook, EP 0771 658 A2 and related patent applications IJ01, IJ02, IJ04, IJ11, IJ12, IJ17, IJ18, IJ20, IJ22, IJ24, IJ27, IJ28, IJ29, IJ30, IJ31, IJ32, IJ33, IJ34, IJ36, IJ37, IJ38, IJ39, IJ40, IJ41, IJ42, IJ43, IJ44 |
| Monolithic, etched through substrate | The nozzle plate is a buried etch stop in the wafer. Nozzle chambers are etched in the front of the wafer, and the wafer is thinned from the back side. Nozzles are then etched in the etch stop layer. | High accuracy (<1 $\mu$m) Monolithic Low cost No differential expansion | Requires long etch times Requires a support wafer | IJ03, IJ05, IJ06, IJ07, IJ08, IJ09, IJ10, IJ13, IJ14, IJ15, IJ16, IJ19, IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | No nozzles to become clogged | Difficult to control drop position accurately Crosstalk problems | Ricoh 1995 Sekiya et al USP 5,412,413 1993 Hadimioglu et al EUP 550,192 1993 Elrod et al EUP 572,220 |
| Trough | Each drop ejector has a trough through which a paddle moves. There is no nozzle plate. | Reduced manufacturing complexity Monolithic | Drop firing direction is sensitive to wicking. | IJ35 |
| Nozzle slit instead of individual | The elimination of nozzle holes and replacement by a slit | No nozzles to become clogged | Difficult to control drop position accurately | 1989 Saito et al USP 4,799,068 |

-continued

NOZZLE PLATE CONSTRUCTION

| | Description | Advantages | Disadvantages | Examples |
|---|---|---|---|---|
| nozzles | encompassing many actuator positions reduces nozzle clogging, but increases crosstalk due to ink surface waves | | Crosstalk problems | |

DROP EJECTION DIRECTION

| | Description | Advantages | Disadvantages | Examples |
|---|---|---|---|---|
| Edge ('edge shooter') | Ink flow is along the surface of the chip, and ink drops are ejected from the chip edge. | Simple construction No silicon etching required Good heat sinking via substrate Mechanically strong Ease of chip handing | Nozzles limited to edge High resolution is difficult Fast color printing requires one print head per color | Canon Bubblejet 1979 Endo et al GB patent 2,007,162 Xerox heater-in-pit 1990 Hawkins et al USP 4,899,181 Tone-jet |
| Surface ('roof shooter') | Ink flow is along the surface of the chip, and ink drops are ejected from the chip surface, normal to the plane of the chip. | No bulk silicon etching required Silicon can make an effective heat sink Mechanical strength | Maximum ink flow is severely restricted | Hewlett-Packard TIJ 1982 Vaught et al USP 4,490,728 IJ02, IJ11, IJ12, IJ20, IJ22 |
| Through chip, forward ('up shooter') | Ink flow is through the chip, and ink drops are ejected from the front surface of the chip. | High ink flow Suitable for pagewidth print heads High nozzle packing density therefore low manufacturing cost | Requires bulk silicon etching | Silverbrook, EP 0771 658 A2 and related patent applications IJ04, IJ17, IJ18, IJ24, IJ27–IJ45 |
| Through chip, reverse ('down shooter') | Ink flow is through the chip, and ink drops are ejected from the rear surface of the chip. | High ink flow Suitable for pagewidth print heads High nozzle packing density therefore low manufacturing cost | Requires wafer thinning Requires special handling during manufacture | IJ01, IJ03, IJ05, IJ06, IJ07, IJ08, IJ09, IJ10, IJ13, IJ14, IJ15, IJ16, IJ19, IJ21, IJ23, IJ25, IJ26 |
| Through actuator | Ink flow is through the actuator, which is not fabricated as part of the same substrate as the drive transistors. | Suitable for piezoelectric print heads | Pagewidth print heads require several thousand connections to drive circuits Cannot be manufactured in standard CMOS fabs Complex assembly required | Epson Stylus Tektronix hot melt piezoelectric ink jets |

INK TYPE

| | Description | Advantages | Disadvantages | Examples |
|---|---|---|---|---|
| Aqueous, dye | Water based ink which typically contains: water, dye, surfactant, humectant, and biocide. Modern ink dyes have | Environmentally friendly No odor | Slow drying Corrosive Bleeds on paper May strikethrough Cockles paper | Most existing ink jets All IJ series ink jets Silverbrook, EP 0771 658 A2 and |

-continued

INK TYPE

| | Description | Advantages | Disadvantages | Examples |
|---|---|---|---|---|
| Aqueous, pigment | high water-fastness, light fastness Water based ink which typically contains: water, pigment, surfactant, humectant, and biocide. Pigments have an advantage in reduced bleed, wicking and strikethrough. | Environmentally friendly No odor Reduced bleed Reduced wicking Reduced strikethrough | Slow drying Corrosive Pigment may clog nozzles Pigment may clog actuator mechanisms Cockles paper | related patent applications IJ02, IJ04, IJ21, IJ26, IJ27, IJ30 Silverbrook, EP 0771 658 A2 and related patent applications Piezoelectric ink-jets Thermal ink jets (with significant restrictions) |
| Methyl Ethyl Ketone (MEK) | MEK is a highly volatile solvent used for industrial printing on difficult surfaces such as aluminum cans. | Very fast drying Prints on various substrates such as metals and plastics | Odorous Flammable | All IJ series ink jets |
| Alcohol (ethanol, 2-butanol, and others) | Alcohol based inks can be used where the printer must operate at temperatures below the freezing point of water. An example of this is in-camera consumer photographic printing. | Fast drying Operates at sub-freezing temperatures Reduced paper cockle Low cost | Slight odor Flammable | All IJ series ink jets |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer roller. | No drying time-ink instantly freezes on the print medium Almost any print medium can be used No paper cockle occurs No wicking occurs No bleed occurs No strikethrough occurs | High viscosity Printed ink typically has a 'waxy' feel Printed pages may 'block' Ink temperature may be above the curie point of permanent magnets Ink heaters consume power Long warm-up time | Tektronix hot melt piezoelectric ink jets 1989 Nowak USP 4,820,346 All IJ series ink jets |
| Oil | Oil based inks are extensively used in offset printing. They have advantages in improved characteristics on paper (especially no wicking or cockle). Oil soluble dies and pigments are required. | High solubility medium for some dyes Does not cockle paper Does not wick through paper | High viscosity: this is a significant limitation for use in ink jets, which usually require a low viscosity. Some short chain and multi-branched oils have a sufficiently low viscosity. Slow drying | All IJ series ink jets |
| Micro-emulsion | A microemulsion is a stable, self forming emulsion of oil, water, and surfactant. The characteristic drop size is less than 100 nm, and is determined by the preferred curvatare of the surfactant. | Stops ink bleed High dye solubility Water, oil, and amphiphilic soluble dies can be used Can stabilize pigment suspensions | Viscosity higher than water Cost is slightly higher than water based ink High surfactant concentration required (around 5%) | All IJ series ink jets |

What is claimed is:

1. A method of manufacturing an ink jet printhead which includes:

providing a substrate;

depositing a plurality of permanent and sacrificial layers on the substrate including at least one permanent layer having a high coefficient of thermal expansion and at least one heating means permanent layer;

etching said permanent layers to form a resiliently deformable actuator;

depositing a further sacrificial layer over said actuator;

etching said further sacrificial layer to form slots therein;

depositing yet a further permanent layer on said further sacrificial layer and in said slots to form a roof and walls, respectively, of a nozzle chamber defining portion;

etching said yet further permanent layer to form a nozzle opening; and etching the sacrificial layers to free the actuator and to form the nozzle chamber and, hence, the printhead, the actuator comprising a first layer consisting of the said at least one permanent layer which is anchored at opposed ends and the heating means layer carried on a surface of said at least one permanent layer closer to the nozzle, the heating means layer being arranged in a second permanent layer, also having a high coefficient of thermal expansion, so that, when said first layer is heated, bowing of the actuator towards the nozzle opening occurs to apply pressure to ink in the nozzle chamber for effecting ink ejection from the nozzle opening.

2. A method of manufacturing an ink jet printhead as claimed in claim 1 wherein multiple ink jet printheads are formed simultaneously on the substrate.

3. A method of manufacturing an ink jet printhead as claimed in claim 1 wherein said substrate is a silicon wafer.

4. A method of manufacturing an ink jet printhead as claimed in claim 1 wherein integrated drive electronics are formed on the same substrate.

5. A method of manufacturing an ink jet printhead as claimed in claim 4 wherein said integrated drive electronics are formed using a CMOS fabrication process.

6. A method of manufacturing an ink jet printhead as claimed in claim 1 wherein ink is ejected from substrate normal to said substrate.

7. A method of manufacturing an ink jet printhead as claimed in claim 1 which includes encasing the heating element in said second layer.

8. A method of manufacturing an ink jet printhead as claimed in claim 1 which includes forming the heating element on the first layer of the actuator in a serpentine manner to compensate for differences between coefficients of thermal expansion of the first layer and the heating element.

* * * * *

UNITED STATES PATENT AND TRADEMARK OFFICE
CERTIFICATE OF CORRECTION

PATENT NO. : 6,331,258 B1 Page 1 of 1
APPLICATION NO. : 09/113074
DATED : December 18, 2001
INVENTOR(S) : Kia Silverbrook It is certified that error appears in the above-identified patent and that said Letters Patent is hereby corrected as shown below:

Column 46, line 8 (claim 6) should read:

--claimed in claim 1 wherein ink is ejected from said substrate--;

Signed and Sealed this

Sixth Day of November, 2007

JON W. DUDAS
*Director of the United States Patent and Trademark Office*